(12) United States Patent
Furuhata

(10) Patent No.: US 6,756,629 B1
(45) Date of Patent: Jun. 29, 2004

(54) SEMICONDUCTOR DEVICES INCLUDING A MULTI-WELL AND SPLIT-GATE NON-VOLATILE MEMORY TRANSISTOR STRUCTURE

(75) Inventor: Tomoyuki Furuhata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/599,477

(22) Filed: Jun. 23, 2000

(30) Foreign Application Priority Data

Aug. 20, 1999 (JP) .......................................... 11-233965

(51) Int. Cl.⁷ ............................................. H01L 29/76
(52) U.S. Cl. .................. 257/314; 257/320; 365/185.24
(58) Field of Search ................................ 257/314–322, 257/390–391; 365/185.24, 185.28, 185.29, 210

(56) References Cited

U.S. PATENT DOCUMENTS

| | | | |
|---|---|---|---|
| 4,651,406 A | 3/1987 | Shimizu et al. ............. 438/275 |
| 4,688,063 A * | 8/1987 | Lu et al. ...................... 257/304 |
| 5,045,488 A | 9/1991 | Yeh ............................. 438/257 |
| 5,108,941 A | 4/1992 | Paterson et al. .............. 437/47 |
| 5,153,143 A | 10/1992 | Schlais et al. .............. 438/201 |
| 5,242,848 A | 9/1993 | Yeh ............................ 438/266 |
| 5,278,087 A | 1/1994 | Jenq ........................... 438/594 |
| 5,309,371 A | 5/1994 | Shikata et al. ................. 716/10 |
| 5,378,919 A | 1/1995 | Ochiai ........................ 257/204 |
| 5,379,253 A | 1/1995 | Bergemont .................. 365/185 |
| 5,557,122 A | 9/1996 | Shrivastava et al. ........ 257/309 |
| 5,572,054 A | 11/1996 | Wang et al. ................. 257/322 |
| 5,604,150 A | 2/1997 | Mehrad ....................... 438/257 |
| 5,650,344 A * | 7/1997 | Ito et al. ..................... 438/287 |
| 5,652,450 A * | 7/1997 | Hirano ........................ 257/323 |
| 5,654,577 A * | 8/1997 | Nakamura et al. .......... 257/392 |
| 5,674,762 A | 10/1997 | See et al. .................... 438/234 |
| 5,677,867 A | 10/1997 | Hazani ........................ 365/185 |

(List continued on next page.)

FOREIGN PATENT DOCUMENTS

| | | | |
|---|---|---|---|
| JP | 03219496 A * | 9/1991 | |
| JP | 7-142617 | 6/1995 | ....... H01L/21/8247 |
| JP | 7-147336 | 6/1995 | ....... H01L/21/8247 |
| JP | 9-321156 | 12/1997 | ....... H01L/21/8247 |
| JP | 9-321157 | 12/1997 | ....... H01L/21/8247 |
| JP | 11-074389 | 3/1999 | ....... H01L/21/8247 |
| JP | 2000-188344 | 7/2000 | ....... H01L/21/8247 |

OTHER PUBLICATIONS

U.S. Ser. No. 09/663,258 (filed Sep. 15, 2000) and pending claims, US. Pat. #6537869.
U.S. Ser. No. 09/602,535 (filed Jun. 23, 2000), U.S. Pat # 6429073.
U.S. Ser. No. 09/602,766 (filed Jun. 23, 2000), U.S. Pat. # 6522587.
U.S. Ser. No. 09/604,702 (filed Jun. 23, 2000), Central Files.

*Primary Examiner*—Minhloan Tran
*Assistant Examiner*—Thomas L Dickey
(74) *Attorney, Agent, or Firm*—Konrad Raynes & Victor, LLP; Alan S. Raynes

(57) ABSTRACT

Embodiments include a semiconductor device including a non-volatile memory transistor with a split-gate structure that is operable at a lower voltage. The semiconductor device includes a P-type silicon substrate 10 that includes a memory region 4000, an N-type first well 11 located in the memory region 4000, and a P-type second well located in the first well 11. The semiconductor device includes a non-volatile memory transistor with a split-gate structure. A source 16 and a drain 14 of the non-volatile memory transistor are located in the second well 12. The silicon substrate 10 and the second well 12 are isolated from each other by the first well 11. Therefore, the potential of the second well 12 can be set independently of the potential of the silicon substrate 11.

9 Claims, 16 Drawing Sheets

U.S. PATENT DOCUMENTS

| | | | |
|---|---|---|---|
| 5,687,118 A | 11/1997 | Chang | 365/185.19 |
| 5,712,178 A | 1/1998 | Cho et al. | 438/201 |
| 5,748,536 A | 5/1998 | Kwon et al. | 365/185.25 |
| 5,907,172 A | 5/1999 | Sheu | 257/317 |
| 5,908,311 A | 6/1999 | Chi et al. | 438/258 |
| 5,914,514 A | 6/1999 | Dejenfelt et al. | 257/322 |
| 5,939,749 A | 8/1999 | Taketa et al. | 257/316 |
| 5,969,383 A | 10/1999 | Chang et al. | 257/316 |
| 6,004,847 A | 12/1999 | Clementi et al. | 438/258 |
| 6,015,984 A | 1/2000 | Leu | 257/298 |
| 6,017,795 A | 1/2000 | Hsieh et al. | 438/262 |
| 6,043,123 A | 3/2000 | Wang et al. | 438/258 |
| 6,090,656 A | 7/2000 | Randazzo | 438/239 |
| 6,103,573 A | 8/2000 | Harari et al. | 438/257 |
| 6,144,064 A | 11/2000 | Cho et al. | 257/321 |
| 6,157,060 A | 12/2000 | Kerber | 257/316 |
| 6,184,093 B1 | 2/2001 | Sung | 438/275 |
| 6,194,269 B1 | 2/2001 | Sung et al. | 438/258 |
| 6,242,773 B1 * | 6/2001 | Thomas | 257/315 |

* cited by examiner

SEMICONDUCTOR DEVICES INCLUDING A MULTI-WELL AND SPLIT-GATE NON-VOLATILE MEMORY TRANSISTOR STRUCTURE

Japanese patent application No. 11-233965, filed Aug. 20, 1999, is hereby incorporated by reference in its entirety.

TECHNICAL FIELD

The present invention relates to semiconductor devices having a non-volatile memory transistor and includes a semiconductor device comprising a non-volatile memory transistor with a split gate structure.

BACKGROUND

There are a variety of different types of non-volatile memory transistors. One type of the non-volatile memory transistors can electrically write and ease data. Such type also runs a great variety. For example, one of the non-volatile memory transistors has a P-type semiconductor substrate, a P-type well located in the semiconductor substrate, a source and drain of an N-type located in the well and a gate with a split-gate structure located over the well through a thin insulation layer.

In a non-volatile memory transistor having the above-described structure, the semiconductor substrate is normally grounded, and therefore the well has a ground potential. As a result, a high voltage of one polarity (for example, a positive polarity) must be used for data writing and erasing operations.

SUMMARY

One embodiment relates to a semiconductor device having a non-volatile memory transistor having a split structure. The semiconductor device includes a semiconductor substrate of a first conductivity type having a memory region. A first well of a second conductivity type is located in the memory region, and a second well of a first conductivity type located in the first well. The non-volatile memory transistor includes a source and drain that are located in the second well. In one aspect of certain embodiments, the semiconductor substrate is a p-type, the first well is an n-type, the second well is a p-type, and each of the pair of source and drain is an n-type.

Other embodiments relate to a semiconductor device having a non-volatile memory transistor having a split-gate structure, the semiconductor device including a semiconductor substrate of a first conductivity type having a memory region. The semiconductor device also includes a first well of a second conductivity type located in the memory region and a second well of a first conductivity type located in the first well. The non-volatile memory transistor includes a source and drain that are located in the second well. The non-volatile memory transistor includes a split gate structure including a source, a drain, a gate insulation layer, a floating gate, an intermediate insulation layer adapted to act as a tunnel insulation layer, and a control gate. The intermediate insulation layer is composed of at least three insulation layers, wherein a first layer of the three insulation layers contacts the floating gate, a third layer contacts the control gate, and a second layer is located between the first and third layers.

Other embodiments relate to a semiconductor device having a non-volatile memory transistor having a split-gate structure. The semiconductor device includes means for performing an data writing operation using a first voltage of a first polarity and a data erasing operation using a second voltage of a second polarity opposite from that of the first polarity. The means include a substrate selected from the group of a P-type substrate and an N-type substrate, a first well of an opposite type than the substrate, a second well of an opposite type than the first well, and a source and drain formed in the second well.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION

Figure 1:
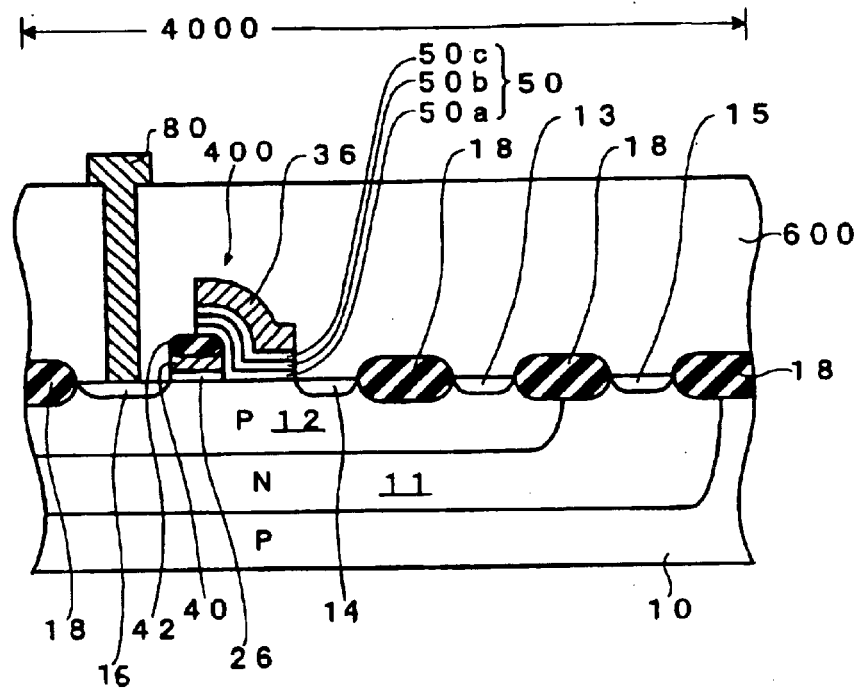
FIG. 1 is a schematic cross-sectional view of a semiconductor device in accordance with an embodiment of the present invention.
Figure 1:
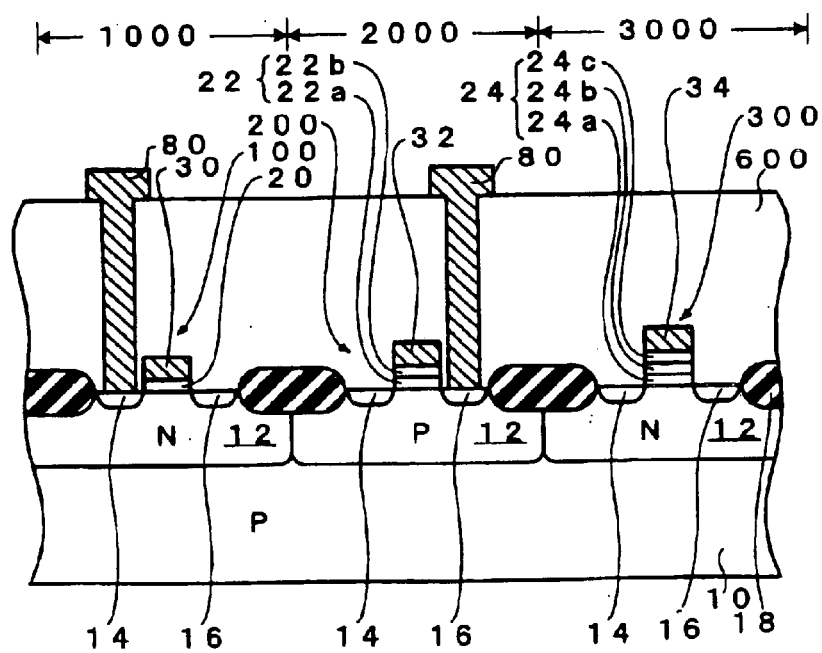

Certain embodiments of the present invention provide a semiconductor device including a non-volatile memory transistor with a split-gate structure that is operable at a lower voltage.

One embodiment provides a semiconductor device including a non-volatile memory transistor with a split-gate structure. The semiconductor device includes a semiconductor substrate of a first conductivity type having a memory region, a first well of a second conductivity type located in the memory region, and a second well of a first conductivity type located in the first well, wherein the non-volatile memory transistor having a source and drain that are located in the second well.

The effects provided by a semiconductor device having the structure described above in accordance with the present invention will be described below. In a semiconductor device in accordance with the above-described embodiment, the semiconductor substrate of the first conductivity type and the second well of the first conductivity type are isolated from each other by the first well of the second conductivity type. Accordingly, potentials of the second well and the semiconductor substrate can be set separately and independently from one another. For example, when the semiconductor substrate has a ground potential, the second well can be set at a negative potential (or a positive potential). Since the second well is set at a negative potential (or a positive potential), a sufficient potential difference that can operates the non-volatile memory transistor can be obtained even when the control gate or the source/drain has a low positive voltage (or a negative potential).

In the semiconductor device in accordance with the above-described embodiment, the non-volatile memory transistor may preferably be operated using positive and negative voltages. In other words, when the non-volatile memory transistor is operated by an application of a positive voltage to the control gate or the source/drain, a negative voltage is applied to the second well. Alternatively, when the non-volatile memory transistor is operated by an application of a negative voltage to the control gate or the source/drain, a positive voltage is applied to the second well.

When the non-volatile memory transistor is operated using a positive voltage and a negative voltage, a sufficient potential difference to operate the non-volatile memory transistor can be obtained even when a relatively low positive voltage in the used voltage and a relatively low negative voltage in an absolute value are combined.

In a semiconductor device in accordance with the above embodiment, the operation of the non-volatile memory transistor includes writing and/or erasing data in the non-volatile memory transistor. This is because a relatively large potential difference is normally required for writing data in and/or erasing data from the non-volatile memory transistor.

In a semiconductor device in accordance with the above embodiment, the semiconductor substrate may preferably be a p-type, the first well may preferably be an n-type, the second well may preferably be a p-type, and each of the source and drain may preferably be an n-type.

The following voltages may preferably be applied for writing data in the non-volatile memory transistor: namely, a voltage in an opposite polarity is applied to the control gate, a voltage in one polarity is applied to one of the source and the drain, a voltage in the opposite polarity is applied to the other of the source and the drain, a voltage in the opposite polarity is applied to the second well, and a voltage in the one polarity is applied to the first well. The following voltages may preferably be applied for erasing data in the non-volatile memory transistor: namely, a voltage in the one polarity is applied to the control gate, a voltage in the opposite polarity is applied to one of the source and the drain, a voltage in the opposite polarity is applied to the other of the source and the drain, a voltage in the opposite polarity is applied to the second well, and a voltage in the one polarity is applied to the first well.

In this embodiment, the term "one polarity" refers to a polarity that is different from another polarity. Also, the term "opposite polarity" refers to a polarity that is different from the one polarity. Therefore, for example, when one polarity is a positive polarity, the opposite polarity refers to a negative polarity. Also, when one polarity is a negative polarity, the opposite polarity is a positive.

Voltages in accordance with a preferred embodiment are as follows:

When data is written in the non-volatile memory transistor, a voltage of −3 V through −4 V is applied to the control gate, a voltage of +3 V through +4 V is applied to one of the source and the drain, a voltage of −5 V through −6 V is applied to the other of the source and the drain, a voltage of −5 V through −6 V is applied to the second well, and a voltage of +0.9 V through +3.3 V is applied to the first well.

When data is erased from the non-volatile memory transistor, a voltage of +6 V through +7 V is applied to the control gate, a voltage of −5 V through −6 V is applied to one of the source and the drain, a voltage of −5 V through −6 V is applied to the other of the source and the drain, a voltage of −5 V through −6 V is applied to the second well, and a voltage of +0.9 V through +3.3 V is applied to the first well.

In a semiconductor device in accordance with certain embodiments of the present invention, data may preferably be written in the non-volatile memory transistor by channel hot electrons, and data may preferably be erased by the Fowler Nordheim Tunneling.

In a semiconductor device in accordance with certain embodiments of the present invention, the source and the drain may preferably have an impurity concentration of $1-8 \times 10^{20}$ cm$^{-3}$, the second well may preferably have a surface impurity concentration of $0.5-5 \times 10^{16}$ cm$^{-3}$, and the second well may preferably have a peak impurity concentration of $1-4 \times 10^{17}$ cm$^{-3}$. When the impurity concentrations of the source/drain and the second well are set at relatively high levels in the ranges described above, the junction dielectric strength between the source/drain and the second well is lowered. However, in the semiconductor device in accordance with certain embodiments of the present invention, the non-volatile memory transistor can be operated by a lower voltage. Accordingly, even when the junction dielectric strength between the source/drain and the second well is low, the non-volatile memory transistor is operational.

It is noted that the "surface impurity concentration" of the second well refers to an impurity concentration in the surface layer of the second well. The "peak impurity concentration" of the second well refers to an impurity concentration of a layer in the second well that has a peak impurity concentration.

In certain embodiments of the present invention, the first well and the second well may preferably be retrograde wells. The retrograde well is a well that has a peak impurity concentration in a deep area thereof and the impurity concentration becomes greater along a direction of the depth.

In the semiconductor device in accordance with certain preferred embodiments of the present invention, the non-volatile memory transistor can be operated with a lower voltage, and a step-up circuit without a complicated structure can be used as a step-up circuit for the semiconductor device of the present invention.

In the semiconductor device in accordance with certain preferred embodiments of the present invention, the non-volatile memory transistor has a first gate insulation layer, a second gate insulation layer, a floating gate, a control gate and an intermediate insulation layer functioning as a tunnel insulation layer. The first gate insulation layer and the second gate insulation layer are located above the second well and between one of the pair of source and drain and the other of the pair of source and drain. The floating gate is located above the first gate insulation layer. The intermediate insulation layer is located above the floating gate, and the control gate is located above the second gate insulation layer and rests on the floating gate through the intermediate insulation layer.

In the semiconductor in accordance with a preferred embodiment of the present invention, the semiconductor substrate includes first, second and third transistor regions including field effect transistors that operate at different voltage levels, wherein the first transistor region includes a first voltage-type transistor that operates at a first voltage level, the second transistor region includes a second voltage-type transistor that operates at a second voltage level, and the third transistor region includes a third voltage-type transistor that operates at a third voltage level, wherein the second voltage-type transistor has a gate insulation layer formed from at least two insulation layers, and includes an insulation layer that is formed in the same step in which a gate insulation layer of the first voltage-type transistor is formed.

According to the structure described above, the semiconductor device has the first through the third voltage-type transistors that are operated at at least three different voltage levels, namely, the first through the third voltage levels, such that logic that operate at these voltage levels can be mounted. Further, because of the voltage-type transistors, not only the logic that are required to operate the non-volatile memory transistor, but also other circuit regions may be mixed and provided in the semiconductor device.

Also, the second voltage-type transistor preferably has a gate insulation layer formed from at least two insulation layers, and one of them preferably includes an insulation layer that is formed in the same step in which a gate insulation layer of the first voltage-type transistor is formed. As a result, the number of manufacturing steps can be reduced.

In the semiconductor device in accordance with a preferred embodiment of the present invention, the third voltage-type transistor has a gate insulation layer formed from at least three insulation layers, and includes an insulation layer that is formed in the same step in which the gate insulation layer of the first voltage-type transistor is formed. As a result, the number of manufacturing steps is further reduced.

In the semiconductor in accordance with a preferred embodiment of the present invention, the intermediate insulation layer of the non-volatile memory transistor may be formed from at least three insulation layers, wherein first and second outermost layers of the three insulation layers respectively contact the floating gate and the control gate and may be formed from a thermal oxidation method. Because the outermost layers contact the floating gate and the control gate, the respective interface states stabilize. As a result, an electric charge is smoothly transferred due to the FN conduction (Fowler-Nordheim tunneling), and thus the operation of the non-volatile memory transistor stabilizes. Further, the outermost layer that contacts the control gate of the intermediate insulation layer may preferably be formed in the same step in which the gate insulation layer of the first voltage-type transistor is formed. As a result, the number of manufacturing steps is further reduced.

In the semiconductor in accordance with a preferred embodiment of the present invention, the intermediate insulation layer may preferably include a silicon oxide layer between the first and the second outermost layers that is formed by a CVD method. Because of the presence of the silicon oxide layer, the dielectric strength between the floating gate and the control gate increases. Also, malfunctions that may occur at the time of writing in or reading from memory cells, namely, write disturbs and read disturbs, can be inhibited.

Considering the characteristics of the formed film (e.g., the density, the permeability resistance against oxygen ions and the like), the silicon oxide layer that is formed by the CVD method may preferably be formed by a HTO (high temperature oxide) method using monosilane or tetraethylorthosilicate, a TEOS (tetraethyl ortho silicate) method using ozone as an oxidation agent, or a plasma TEOS method.

The third voltage-type transistor preferably has a gate insulation layer formed in the same step in which the intermediate insulation layer of the non-volatile memory transistor is formed, and the gate insulation layer of the third voltage-type transistor being is preferably formed from at least three insulation layers. This results in a further reduction in the number of manufacturing steps.

The film thickness of the gate insulation layer of each of the voltage-type transistors may preferably be in the following ranges, in consideration of the dielectric strength of the voltage-type transistors. The gate insulation layer of the first voltage-type transistor may preferably have a film thickness of 3–13 nm. The gate insulation layer of the second voltage-type transistor may preferably have a film thickness of 4–15 nm. The gate insulation layer of the third voltage-type transistor may preferably have a film thickness of 16–45 nm.

Considering the characteristics of the tunnel insulation layer, the intermediate insulation layer of the non-volatile memory transistor may preferably have a film thickness of 16–45 nm. Further, the first outermost layer that forms the intermediate insulation layer of the non-volatile memory transistor may preferably have a film thickness of 5–15 nm, and the second outermost layer may preferably have a film thickness of 1–10 nm. When the intermediate insulation layer has a silicon oxide layer formed between the first and the second outermost layers, the first outermost layers may preferably have a film thickness of 5–15 nm, the second outermost layer may preferably have a film thickness of 1–10 nm, and the silicon oxide may preferably have a film thickness of 10–20 nm.

Further, a selective oxide insulation layer may preferably be formed on the floating gate. Because the selective oxide insulation layer is formed, upper edge sections of the floating gate form sharp edges, such that an electric field concentration likely occurs at the upper edges of the floating gate.

Each of the voltage-type transistors may preferably be operated at a voltage level in the following ranges: The first voltage level that operates the first voltage-type transistor may preferably be at 1.8–3.3 V in an absolute value, the second voltage level that operates the second voltage-type transistor may preferably be at 2.5–5 V in an absolute value, and the third voltage level that operates the third voltage-type transistor may preferably be at 10–15 V in an absolute value.

The semiconductor device in accordance with the present invention may further comprise at least a flash-memory (flash EEPROM), and the flash-memory include a memory cell array of non-volatile memory transistors and a peripheral circuit formed therein. Also, the semiconductor device may further be mixed with other circuit regions such as logic regions mounted therein.

The other circuit regions include, for example, cell-base circuits, memory circuits such as ROMs and RAMs, RISC (reduced instruction set computer), IP (intellectual property) macros, and analog circuits.

The first voltage-type transistor may, for example, be included in at least one circuit selected from a group consisting of a Y-gate, sense amplifier, an input/output buffer, an X-address decoder, a Y-address decoder, an address buffer and a control circuit.

The second voltage-type transistor may, for example, be included in at least one circuit selected from a group consisting of a Y-gate, sense amplifier, an input/output buffer, an X-address decoder, a Y-address decoder and an interface circuit.

The third voltage-type transistor may, for example, be included in at least one circuit selected from a group consisting of a voltage generation circuit, an erase voltage generation circuit and a step-up voltage circuit.

FIG. 1 schematically shows a cross-sectional view of a semiconductor device including a non-volatile memory transistor in accordance with an embodiment of the present invention. The semiconductor device includes a semiconductor substrate 10 that includes a memory region 4000, a first transistor region 1000, a second transistor region 2000 and a third transistor region 3000. It should be noted that FIGS. 1–14 include parts (a) and (b), which represent different sections of the same semiconductor device according to certain embodiments of the present invention.

The memory region 4000 includes a non-volatile memory transistor with a split-gate structure (hereinafter referred to as "memory transistor") 400. The first transistor region 1000 includes a first voltage-type transistor 100 that operates at a first voltage level V1 (preferably 1.8–3.3V in an absolute value). The second transistor region 2000 includes a second voltage-type transistor 200 that operates at a second voltage level V2 (preferably 2.5–5V in an absolute value). The third transistor region 3000 includes a third voltage-type transistor 300 that operates at a third voltage level V3 (preferably 10–15V in an absolute value). Embodiments of circuits that use the first voltage-type transistor 100, the second voltage-type transistor 200 and the third voltage-type transistor 300 will be described below.

In the memory region 4000, a first well 11 of an N-type is formed in the P-type silicon substrate 10. A second well 12 of a P-type is formed in the first well 11. A memory transistor 400 is formed in the second well 12. The semiconductor substrate 10 and the second well 12 are separated from each other by the first well 11.

The first voltage-type transistor 100, the second voltage-type transistor 200, and the third voltage-type transistor 300 are respectively formed in the second wells 12 that are formed in the P-type silicon substrate 10.

The memory region 4000 and the first through the third transistor regions 1000, 2000 and 3000 are respectively isolated from one another by field insulation layers 18. Also, the transistors in the respective regions 1000 through 4000 are isolated by field insulation layers (not shown) formed in predetermined patterns. In the embodiment shown in the figure, each of the first through the third voltage-type transistors 100, 200 and 300 is formed in each of the second wells 12. However, when wells are not required, they may be formed in the substrate. For example, in certain embodiments, the N-channel type second voltage-type transistor may be formed in the substrate, but not in a well.

The first through the third transistor regions 1000, 2000 ad 3000 and the memory region 4000 may respectively include N-channel type and P-channel type transistors. However, for the simplicity of description, FIG. 1 shows transistors of either one of the conductivity types.

The memory transistor 400 has a source 16 and a drain 14 composed of N+ type impurity diffusion layers formed in the second well 12, and a gate insulation layer 26 formed on the surface of the second well 12. A floating gate 40, an intermediate insulation layer 50 and a control gate 36 are formed on the gate insulation layer 26.

Further, a selective oxide insulation layer 42 is formed on the floating gate 40. The selective oxide insulation layer 42 is preferably formed by selective oxidation on a part of a polycrystal silicon layer that becomes the floating gate, as described below, and preferably has a structure in which the thickness thereof becomes thinner from its center toward its end sections. As a result, upper edge sections of the floating gate 40 form sharp edges, such that an electric field concentration likely occurs at the upper edges of the floating gate 40.

The thickness of the gate insulation layer 26 of the memory transistor 400 may preferably be 6–9 nm, in consideration of the dielectric strength of the memory transistor 400.

The intermediate insulation layer 50 continues from the top surface of the selective oxide insulation film 42 to the side surface of the floating gate 40, further extends along the surface of the silicon substrate 10 and reaches one end of the source 16. The intermediate insulation layer 50 functions as what is referred to as a tunnel insulation layer. Further, the intermediate insulation layer 50 is composed of three insulation layers (silicon oxide layers), which are, in the order from the bottom, a first insulation layer 50a, a second insulation layer 50b and a third insulation layer 50c. The first and the third insulation layers 50a and 50c are composed of silicon oxide layers that are formed by a thermal oxidation method. The second insulation layer 50b is composed of a silicon oxide layer that is formed by a CVD method.

The intermediate insulation layer 50 may preferably have a film thickness of 16–45 nm, in consideration of its function as a tunnel insulation layer. The first insulation layer 50a may preferably have a film thickness of 5–15 nm, the second intermediate insulation layer 50b may preferably have a film thickness of 10–20 nm, and the third insulation layer 50c may preferably have a film thickness of 1–10 nm.

The intermediate insulation layer 50 that functions as a tunnel insulation layer has a three-layer structure, and the first insulation layer (a first outermost layer) 50a and the third insulation layer (a second outermost layer) 50c that respectively contact the floating gate 40 and the control gate 36 are preferably formed from thermal oxidation films. As a result, the interface state between the floating gate 40 and the first insulation layer 50a stabilizes, and the interface state between the control gate 36 and the third insulation layer 50c stabilizes. As a consequence, the transfer of the charge by the FN conduction from the floating gate 40 through the intermediate insulation layer 50 to the control gate 36 becomes stable, and thus the operation of the memory transistor 400 stabilizes. This contributes to an increase in the number of data writing/erasing operations (cycle life) of the memory transistor 400.

Also, because the intermediate insulation layer 50 has the second insulation layer 50b that is composed of a silicon oxide layer which is formed by a CVD method, the dielectric strength between the floating gate 40 and the control gate 36 increases. Also, malfunctions that may occur at the time of writing in or reading from memory cells, namely, write disturbs and read disturbs, can be inhibited.

An N+ type contact region 15 is formed in the first well 11. A field insulation layer 18 is formed around the N+ type contact region 15. A voltage is applied to the first well 11 through the N+ type contact region 15. Also, a P+ type contact region 13 is formed in the second well 12. A field insulation layer 18 is formed around the P+ type contact region 13. A voltage is applied to the second well through the P+ type contact region 13.

The first voltage-type transistor 100, when it is a P-channel type MOS transistor, for example, has a source 16 and a drain 14 that are composed of P+ type impurity diffusion layers which are formed in the N-type first well 12, a first gate insulation layer 20 and a first gate electrode 30. The first voltage-type transistor 100 is preferably driven at a first voltage level V1 (1.8–3.3 V in an absolute value). The first gate insulation layer 20 may preferably have a film thickness of 3–13 nm, in consideration of factors such as the dielectric strength of the first voltage-type transistor 100.

The second voltage-type transistor 200, when it is an N-channel type MOS transistor, for example, has a source 16 and a drain 14 that are composed of N+ type impurity diffusion layers which are formed in the P-type first well 12, a second gate insulation layer 22 and a second gate electrode 32. The second gate insulation layer 22 is composed of two silicon oxide layers, namely, a first insulation layer 22a and a second insulation layer 22b. The second insulation layer 22b is formed in the same step in which the first gate insulation layer 20 of the above-described first voltage-type transistor 100 is formed.

The second voltage-type transistor 200 is preferably driven at a second voltage level (2.5–5 V in an absolute value). The second gate insulation layer 22 may preferably have a film thickness of 4–15 nm, in consideration of factors such as the dielectric strength of the second voltage-type transistor 200. Also, the thickness of the first insulation layer 22a may preferably be 3–15 nm, and the thickness of the second insulation layer 22b may preferably be 1–10 nm.

The third voltage-type transistor 300, when it is a P-channel type MOS transistor, for example, has a source 16 and a drain 14 that are composed of $P^+$ type impurity diffusion layers which are formed in the N-type first well 12, a third gate insulation layer 24 and a third gate electrode 34. The third gate insulation layer 24 is formed from three silicon oxide layers, which are, in the order from the bottom, a first insulation layer 24a, a second insulation layer 24b and a third insulation layer 24c. The insulation layers 24a, 24b and 24c may preferably be formed in the same steps in which the first insulation layer 50a, the second insulation layer 50b and the third insulation layer 50c that form the intermediate insulation layer 50 of the memory transistor 400 are formed, respectively.

The third voltage-type transistor 300 is preferably driven at a third voltage level V3 (10–15 V in an absolute value). The third gate insulation layer 24 may preferably have a film thickness of 16–45 nm, in consideration of factors such as the dielectric strength of the third voltage-type transistor 300. The first insulation layer 24a may preferably have a film thickness of 5–15 nm, the second insulation layer 24b may preferably have a film thickness of 10–20 nm, and the third insulation layer 24c may preferably have a film thickness of 1–10 nm.

An interlayer dielectric layer 600 is formed on the wafer in which the memory transistor 400 and the first through the third voltage-type transistors 100, 200 and 300 are formed. The interlayer dielectric layer 600 defines contact holes that reach the sources 16, the drains 14 and the gate electrode of each of the transistors 100, 200, 300 and 400. Contact conductive layers are formed in the contact holes. A wiring layer 80 having a predetermined pattern is formed on the interlayer dielectric layer 600. It is noted that FIG. 1 partially shows the contact conductive layers and wiring layers.

The semiconductor device of this embodiment has the first through the third transistor regions 1000, 2000 and 3000 in which the first through third voltage-type transistors 100, 200 and 300 that respectively operate at at least three different voltage levels (V1, V2 and V3) are formed. According to this semiconductor device, the memory transistor 400 in the memory region 4000 is operable. In the semiconductor device, not only logic for operating a flash EEPROM can be implemented, but also a flash EEPROM and other circuits that are operated at different voltage levels may be mixed and implemented in the same substrate to construct a system LSI. Such circuits include interface circuits, gate array circuits, memory circuits such as RAMs and ROMs and RISCs (reduced instruction set computer), or a variety of IP (Intellectual Property) macro circuits, or other digital circuits and analog circuits.

Methods for operating a memory transistor, an embedded semiconductor device in which a semiconductor device according to embodiments of the present invention is applied, and methods for manufacturing a semiconductor device shown in FIG. 1 will be described below.

For the operation of a memory transistor with a split-gate structure 400 in accordance with one embodiment of the present invention, a channel current flows between the source 16 and the drain 14 to thereby inject a charge (channel hot electrons) in the floating gate 40 when data is written. When data is erased, a predetermined high voltage is applied to the control gate 36 to thereby transfer the charge stored in the floating gate 42 to the control gate 36 by the Fowler-Nordheim tunneling conduction. Each of the operations will be described below.

First, an example of a writing operation will be described. For the data-writing operation, the source 16 is set at a higher potential with respect to the drain 14, and a low potential is applied to the control gate 36. As a result, hot electrons that are generated under the floating gate 40 and near the drain 14 are accelerated toward the floating gate 40, and injected in the floating gate 40 through the gate insulation layer 26 to thereby accomplish the data-writing operation.

In the writing operation, for example, the control gate 36 is set at a potential (Vc) of −3 to −4 V, the source 16 is set at a potential (Vs) of 3 to 4 V, the drain 14 is set at a potential (Vd) of −5 to −6 V, the second well 12 is set at a potential (Vwell$_2$) of −5 to −6 V. and the first well 11 is set at a potential (Vwell$_1$) of 0.9 to 3.3 V.

Next, an example of an erasing operation will be described. For the erasing operation, the control gate 36 is set at a potential higher than the potential of the source 16 and the drain 14. As a result, the charge stored in the floating gate 40 is discharged through the sharp upper edge section of the floating gate 40 by the Fowler-Nordheim tunneling conduction, passing through the intermediate insulation layer 50, to the control gate 36, whereby the data is erased.

In the erasing operation, for example, the control gate 36 is set at a potential (Vc) of 6–7V, the source 16 and the drain 14 are set at potentials (Vs) and (Vd) of −5 to −6 V. The second well 12 is set at a potential (Vwell$_2$) of −5 to −6 V. The first well 11 is set at a potential (Vwell$_1$) of 0.9–3.3 V.

Next, an example of a reading operation will be described. For the reading operation, the drain 14 is set at a higher potential than the source 16, and the control gate 36 is applied with a predetermined potential, whereby a determination is made based on the presence or the absence of a formed channel as to whether or not data is written. More specifically, when a charge is injected in the floating gate 40, the potential of the floating gate 40 becomes low, with the result that a channel is not formed and a drain current does not flow. On the other hand, when the floating gate 40 is not injected with a charge, the floating gate 40 has a high potential, with the result that a channel is formed and a drain current flows. By detecting a current flowing from the drain 14 by a sense amplifier, data in the memory transistor 400 can be read out.

In the reading operation, for example, the control gate 36 is set at a potential (Vc) of 0.9–3.3 V, the source 16 is set at a potential (Vs) of 0V, and the drain 14 is set at a potential (Vd) of 0.9–2 V. The second well 12 is set at a potential (Vwell$_2$) of 0V, and the first well 11 is set at a potential (Vwell$_1$) of 0.9–3.3 V.

The operations described above are examples, and other operation conditions are also applicable in accordance with other embodiments.

It is noted that, in the semiconductor device of certain embodiments of the present invention, positive voltages and negative voltages are used to write data in and erase data from the memory transistor 400. This is because the P-type silicon substrate 10 and the second well 12 are isolated from each other by the N-type first well 11, and therefore the second well 12 can independently be set at a potential different from a potential of the silicon substrate 10. Since positive voltages and negative voltages can be used to write data in and erase data from the memory transistor 400, data can be written in or erased from the memory transistor 400 with a relatively low voltage in one polarity. In other words, a relatively low voltage in one polarity is applied to the source 16 for the data writing operation or a relatively low voltage in one polarity is applied to the control gate 36 for the data erasing operation, a voltage applied to the second well 12 is in an opposite polarity. As a result, a sufficient potential difference is obtained for writing data in or erasing data from the memory transistor 400.

Figure 15:
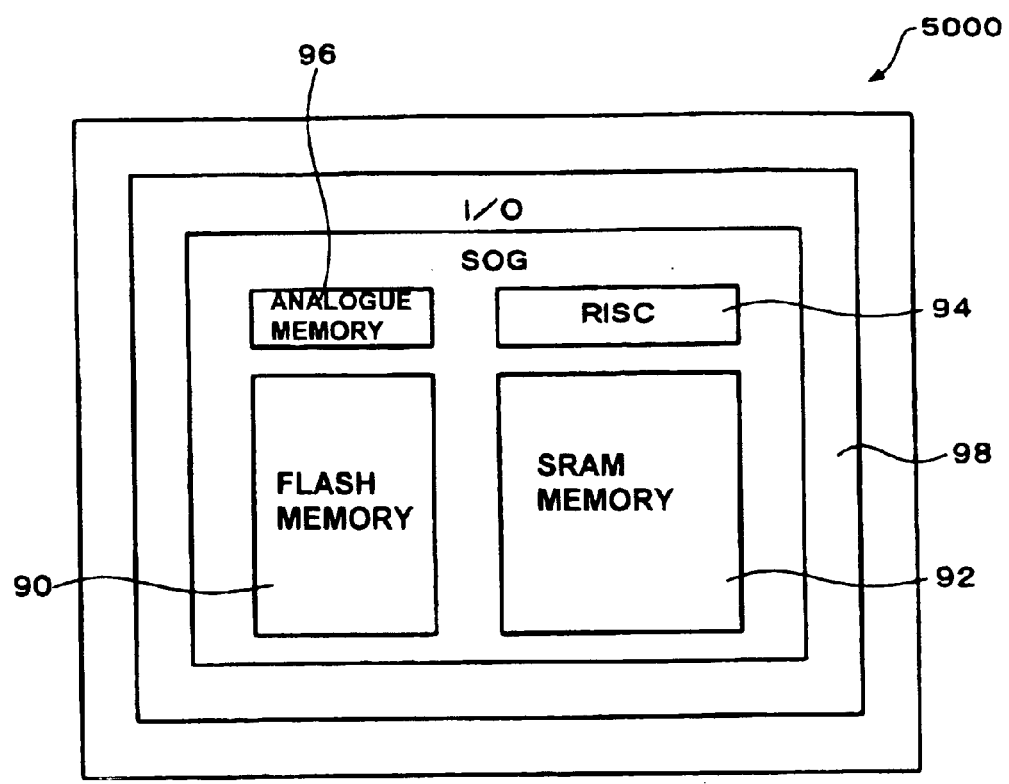
FIG. 15 is a schematic plan view of an embedded semiconductor device employing a semiconductor device in accordance with one embodiment of the present invention.

FIG. 15 schematically shows a layout of an embedded semiconductor device 5000 in which a semiconductor device of an embodiment of the present invention is implemented. In accordance with this embodiment, the embedded semiconductor device 5000 includes a flash-memory (flash EEPROM) 90, an SRAM memory 92, a RISC 94, an analogue circuit 96 and an interface circuit 98 that are mixed and mounted in an SOG (sea of gates) structure.

Figure 16:
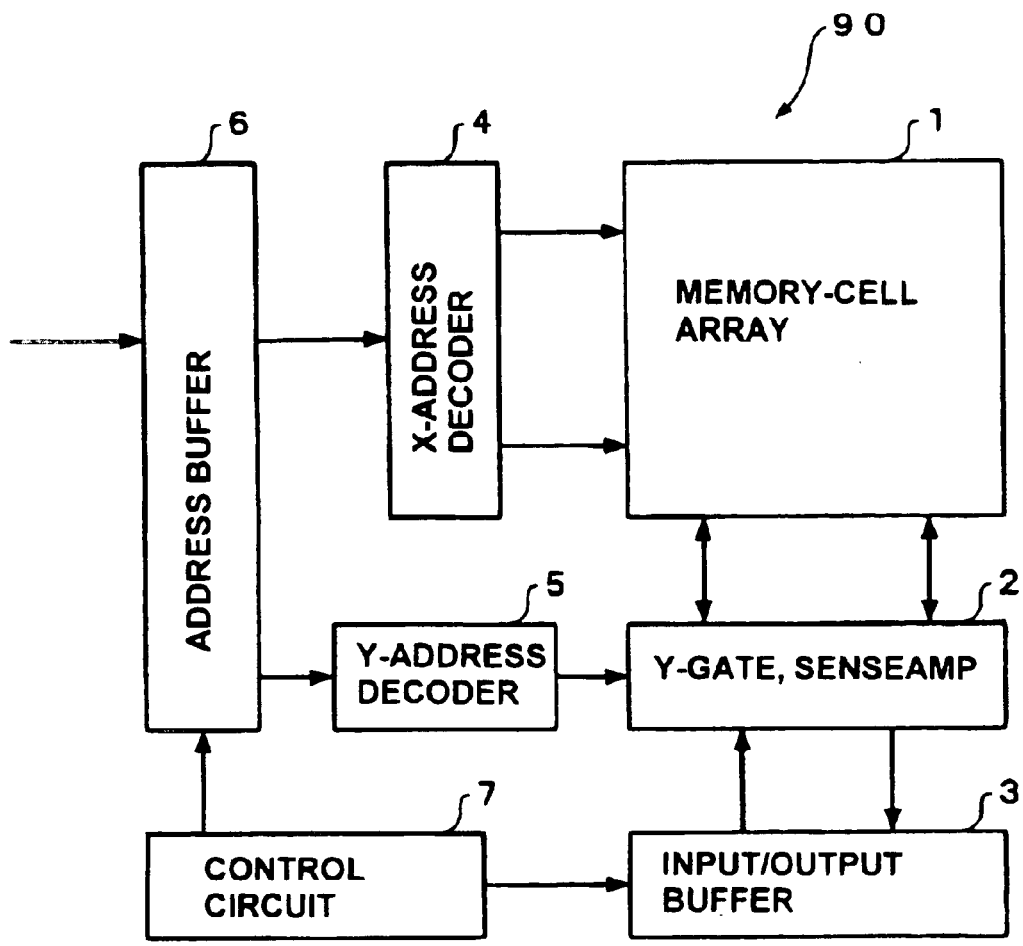
FIG. 16 shows a block diagram of a flash-memory of the embedded semiconductor device shown in FIG. 15.

FIG. 16 shows a block diagram of a structure of a flash-memory. The flash-memory includes a memory cell array 1 in which memory transistors are disposed in an array, a Y-gate, sense amplifier 2, an input/output buffer 3, an X-address decoder 4, a Y-address decoder 5, an address buffer 6 and a control circuit 7.

The memory cell array I corresponds to the memory region 4000 shown in FIG. 1 and has a plurality of split-type memory transistors 400 disposed in a matrix. The memory cell array 1 connects to the X-address decoder 4 and the Y-gate 2 in order to select rows and columns of the memory cell array 1. The Y-gate 2 connects to the Y-address decoder 5 that provides column selection data. The X-address decoder 4 and the Y-address decoder 5 connect to the address buffer 6 that temporarily stores address data.

The Y-gate 2 connects to a write-voltage generation circuit (not shown) for conducting a data-wiring operation, and to a sense amplifier for conducting a data-reading operation. The X-address decoder connects to an erasing-voltage generation circuit for conducting a data-erasing operation. The write-voltage generation circuit and the sense amplifier 2 connect to the input/output buffer 3 that temporarily stores input and output data. The address buffer 6 and the input/output buffer 3 connect to the control circuit 7 that controls the operation of the flash-memories. The control circuit 7 performs the control operation based on chip enable signals, output enable signals and program signals.

In the embedded semiconductor device 5000, transistors operable at different voltage levels are selected depending on the operation voltages of the respective circuits.

The first voltage-type transistor 100 that is operated at a first voltage level is included in, for example, at least one of the Y-gate, sense amplifier, the input/output buffer, the X-address decoder, the Y-address decoder, the address buffer, the control circuit, the SOG and the gate array.

The second voltage-type transistor 200 that is operated at a second voltage is included in, for example, at least one of the Y-gate, sense amplifier, the input/output buffer, the X-address decoder, the Y-address decoder and the interface circuit.

The third voltage-type transistor 300 that is operated at a third voltage is included in, for example, at least one of the writing-voltage generation circuit, the erasing-voltage generation circuit and the step-up circuit.

FIG. 15 shows an example of a layout of the embedded semiconductor device 5000. The present invention is applicable to various types of system LSIs.

Next, a method for manufacturing a semiconductor device such as that shown in FIG. 1 in accordance with one embodiment of the present invention will be described with reference to FIG. 2 through FIG. 14.

Figure 2:
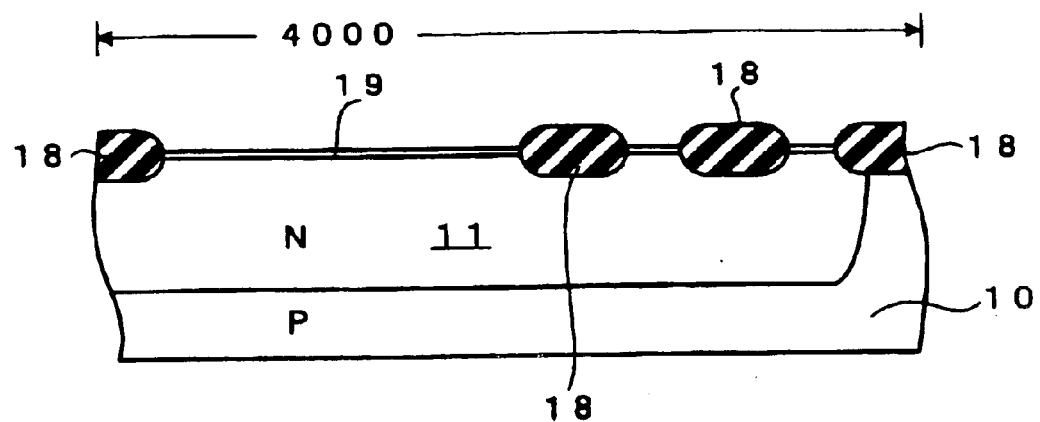
FIGS. 2–14 illustrate cross-sectional views of a wafer during manufacturing for forming the semiconductor device shown in FIG. 1 according to embodiments of the present invention.
Figure 2:
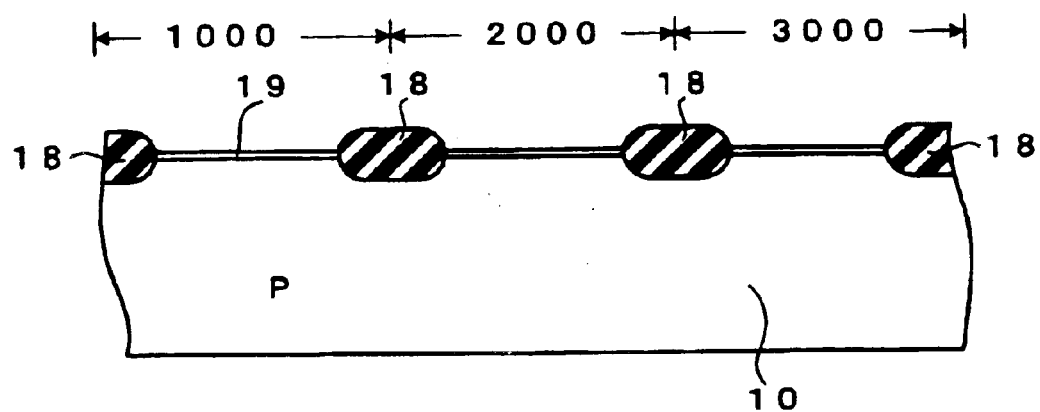

(A) First, as shown in FIG. 2, field insulation layers 18 are formed on the surface of a silicon substrate 10 in predetermined regions thereof by a selective oxidation method. Then, oxide films 19 having a film thickness of 10–40 nm is formed on the surface of the silicon substrate 10 between the field insulation layers 18. A resist (not shown) is then formed on the silicon substrate 10 for exposing the memory region 4000. Ions are selectively implanted in the P-type silicon substrate 10 using the resist as a mask to thereby form a first well 11 in the silicon substrate 10. The ion implantation is conducted under the following preferred conditions:

Ions: Phosphorous ($P^+$)

Dose: $1–3 \times 10^{23}$ $cm^{-2}$

Implanting energy: 1.5–3 MeV

The first well 11 is a retrograded well. The surface impurity concentration of the first well 11 is $3–5 \times 10^{14}$ $cm^{-3}$. The peak impurity concentration is $1–3 \times 10^{17}$ $cm^{-3}$. The junction depth of the first well 11 is 1.5–3 $\mu$m.

Figure 3:
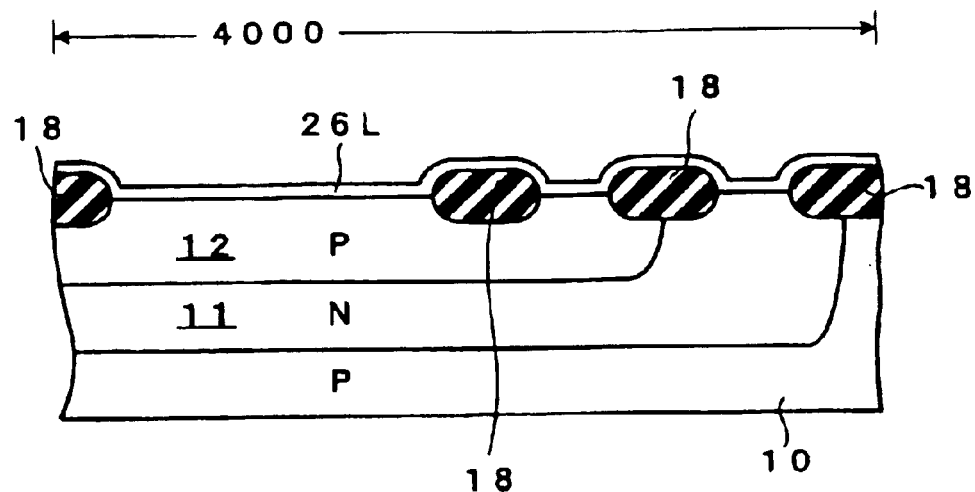
Figure 3:
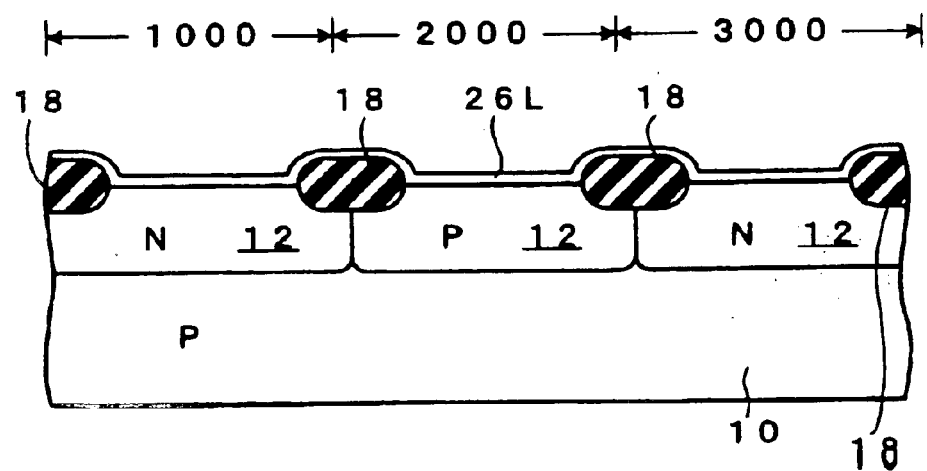

(B) As shown in FIG. 3, a resist (not shown) is formed on the P-type silicon substrate 10 for exposing the first well 11 and a resist (not shown) is formed on the P-type silicon substrate 10 for exposing the second transistor region 2000. Ions are selectively implanted in the P-type silicon substrate 10 using the resists as masks to thereby form P-type second wells 12 within the first well 11 in the memory region 4000 and in the silicon substrate 10 in the second transistor region 2000, respectively. The ion implantation is conducted under the following conditions:

Ions: Boron ($B^+$)

Dose: $1–3 \times 10^{13}$ $cm^{-2}$

Implanting energy: 600 KeV–1.5 MeV

The P-type second well 12 is a retrograded well. The surface impurity concentration of the P-type second well 12 is $0.5–5 \times 10^{16}$ $cm^{-3}$. The peak impurity concentration is $1–4 \times 10^{17}$ $cm^{-3}$. The junction depth of the P-type second well 12 is 0.8–1.5 $\mu$m.

The ion implantation for the P-type second wells 12 may be conducted once, or in a plurality of times. For example, two ion implantation steps can be conducted as follows:

(First Ion Implantation)

Ions: Boron ($B^+$)

Dose: $1–3 \times 10^{13}$ $cm^{-2}$

Implanting energy: 600 KeV–1.5 MeV (Second Ion Implantation)

Ions: Boron ($B^+$)

Dose: $1–5 \times 10^{12}$ $cm^{-2}$

Implanting energy: 100–200 KeV

Then, a resist (not shown) is formed on the P-type silicon substrate 10 for exposing the first transistor region 1000 and the third transistor region 3000. Ions are selectively implanted in the P-type silicon substrate 10 using the resist as a mask to thereby form N-type second wells 12 in the substrate 10 in the first transistor region 1000 and in the silicon substrate 10 in the third transistor region 3000, respectively. The ion implantation is conducted under the following conditions:

Ions: Phosphorous ($P^+$)
Dose: $1–3×10^{13}$ $cm^{-2}$
Implanting energy: 1–2 MeV The N-type second well 12 is a retrograded well. The surface impurity concentration of the N-type second well 12 is $0.5–5×10^{16}$ $cm^{-3}$. The peak impurity concentration is $1–4×10^{17}$ $cm^{-3}$. The junction depth of the N-type second well 12 is 0.8–1.5 µm.

The ion implantation for the N-type second wells 12 may be conducted once, or in a plurality of times. For example, two ion implantation steps can be conducted as follows:
(First Ion Implantation)
Ions: Phosphorous ($P^+$)
Dose: $1–3×10^{13}$ $cm^{-2}$
Implanting energy: 1–2 MeV
(Second Ion Implantation)
Ions: Phosphorous ($P^+$)
Dose: $1–5×10^{12}$ $cm^{-2}$
Implanting energy: 300–500 KeV Then, the oxide film 19 shown in FIG. 2 is removed by a know method.

Further, a silicon oxide layer 26 is formed on the surface of the silicon substrate 10 by a thermal oxidation method, for example. The silicon oxide layer 26L becomes a gate insulation layer 26 of the memory transistor 400. The silicon oxide layer 26L may preferably have a film thickness of 6–9 nm in consideration of factors such as the gate dielectric strength.

Figure 4:
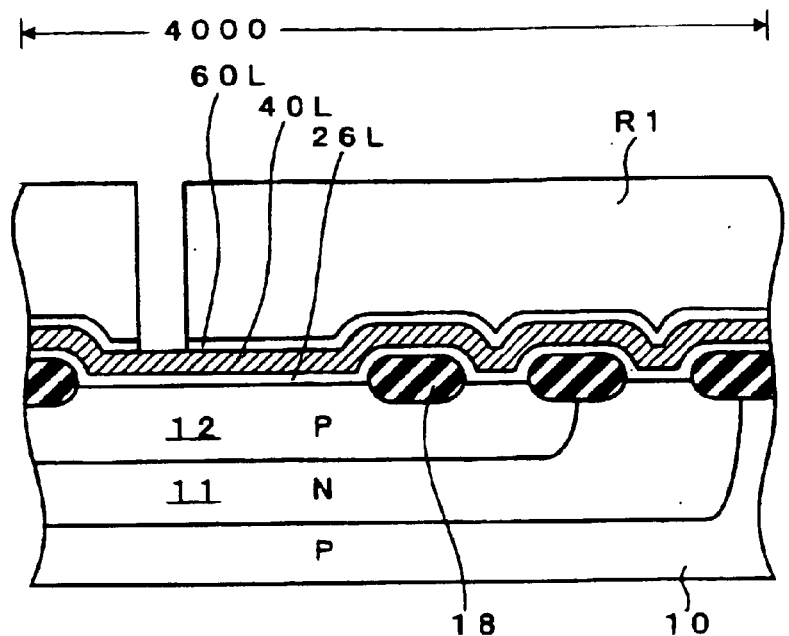
Figure 4:
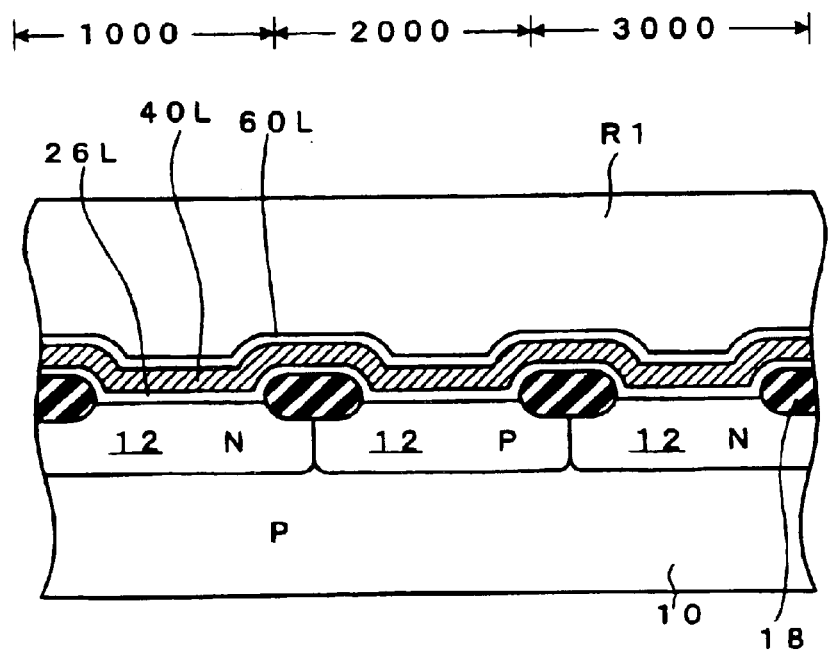

(C) Then, as shown in FIG. 4, a polysilicon layer 40L is formed on the surface of the silicon oxide layer 26L by, for example, a CVD method. The polysilicon layer 40L becomes a floating gate 40 of the memory transistor 400. The polysilicon layer 40L may have a film thickness of 100–200 nm, for example.

Then, a first silicon nitride layer 60L is formed on the surface of the polysilicon layer 40L. The first silicon nitride layer 60L may preferably have a thickness of 50–150 nm. Then, the silicon nitride layer 60L is selectively etched, using a resist layer R1 as a mask, to remove a predetermined region thereof. The region of the first silicon nitride layer 60L that is removed corresponds to a region where a selective oxide insulation layer 42 of the memory transistor 400 is formed.

Then, phosphorous or arsenic is diffused in the polysilicon layer 40L, using the resist layer R1 formed on the first silicon nitride layer 60L as a mask, to form an N-type polysilicon layer 40L. The polysilicon layer may be changed to N-type by other methods. For example, after the polysilicon layer is formed, the polysilicon layer is implanted with phosphorous ions or arsenic ions. Alternatively, after the polysilicon layer is formed, the polysilicon layer is contacted with a carrier gas containing phosphoryl chloride ($POCl_3$). Alternatively, when the polysilicon layer is formed, the layer is contacted with a carrier gas containing phosphine ($PH_3$).

Then, the resist layer R1 is removed.

Figure 5:
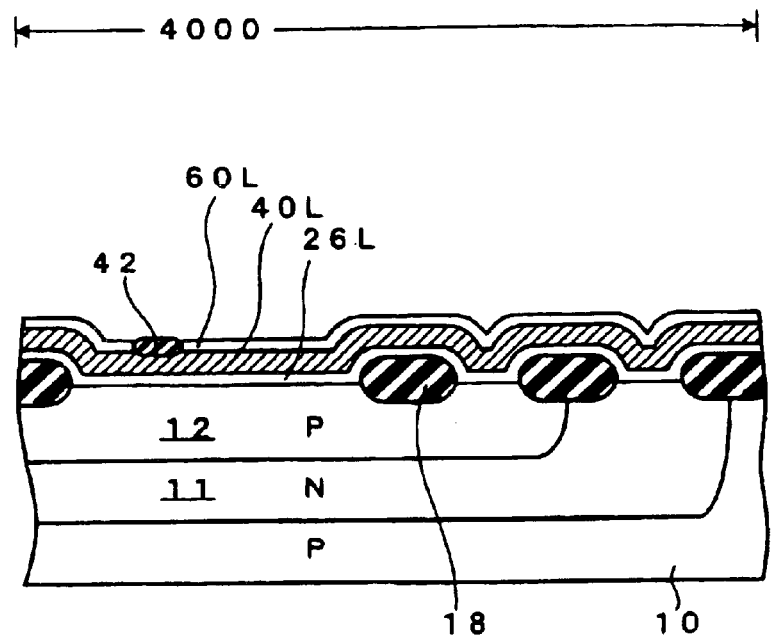
Figure 5:
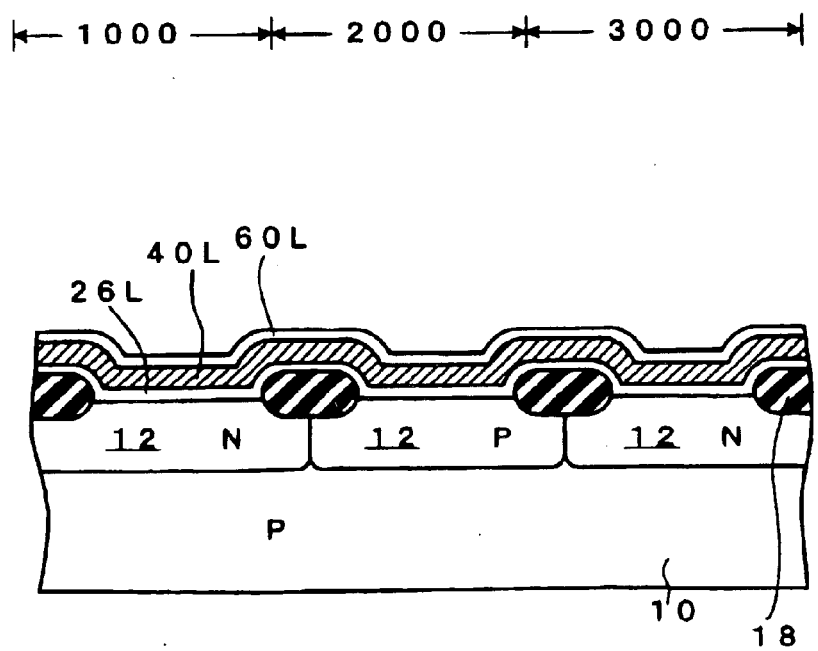

(D) Next, as shown in FIG. 5, an exposed portion in the polysilicon layer 40L is selectively oxidized to form a selective oxide insulation layer 42 on the surface of the polysilicon layer 40L in a predetermined region thereof. The selective oxide insulation layer 42 formed by the selective oxidation has a maximum film thickness at its central area, and gradually becomes thinner toward end sections thereof. The selective oxide insulation layer 42 may preferably have a film thickness of 100–200 nm at the thickest portion. Thereafter, the first silicon nitride layer 60L is removed.

Figure 6:
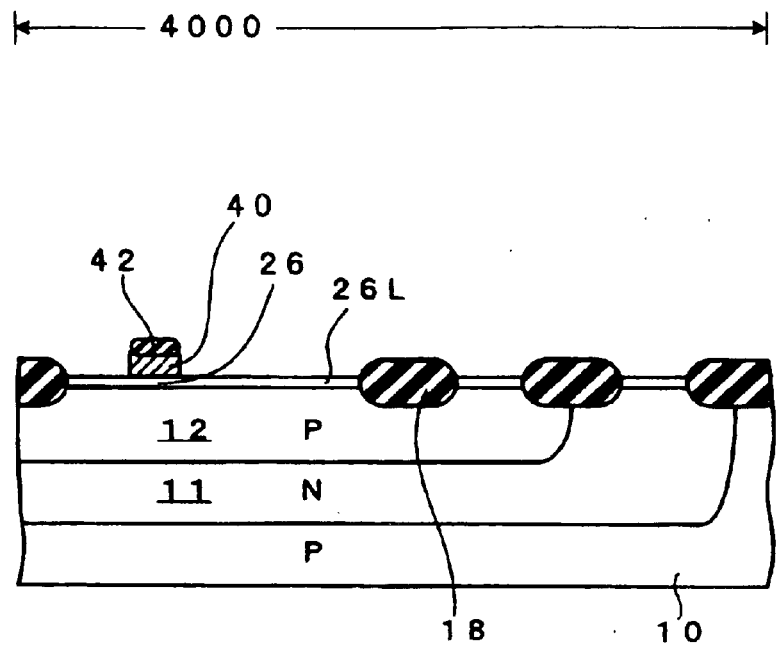
Figure 6:
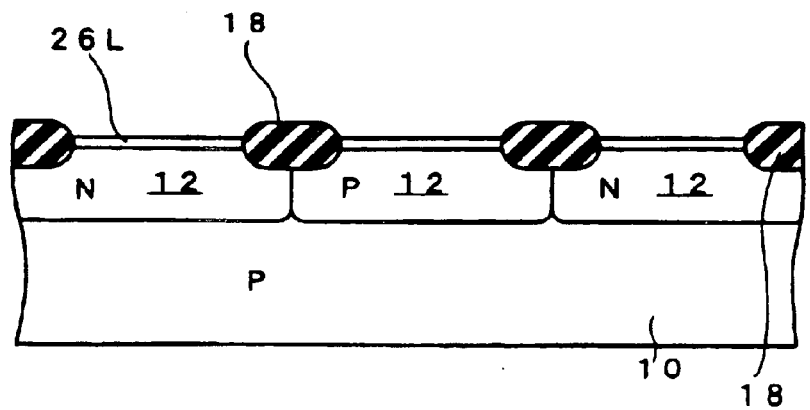

(E) Next, as shown in FIG. 6, an etching is conducted using the selective oxide insulation layer 42 as a mask to selectively remove the polysilicon layer 40L.

By the steps described above, the gate insulation layer 26, the floating gate 40 and the selective oxide insulation layer 42 are formed in the memory region 4000.

Figure 7:
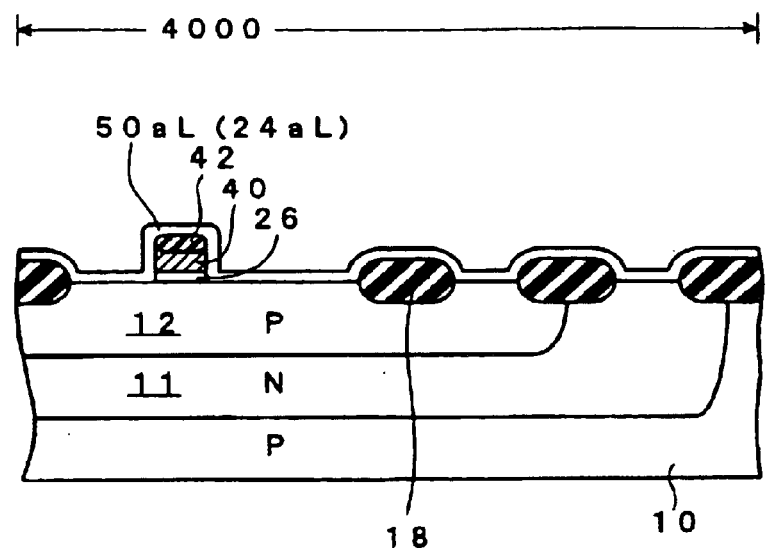
Figure 7:
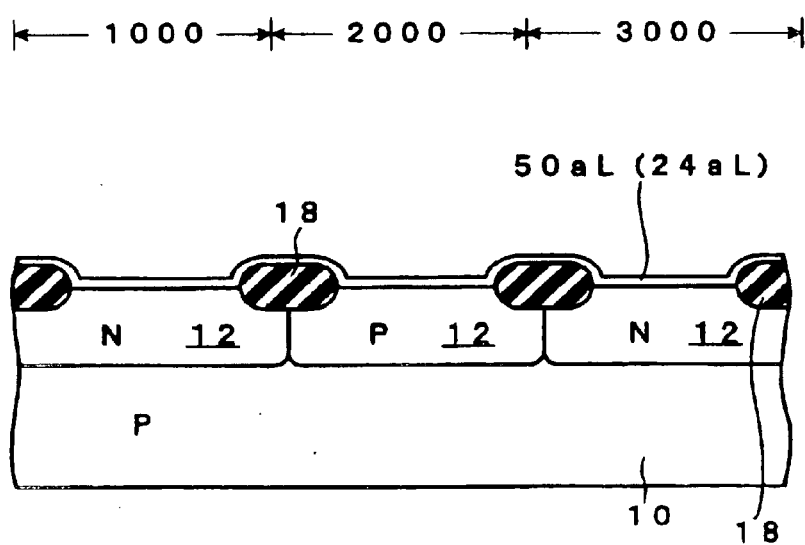

(F) Then, as shown in FIG. 7, the silicon oxide layer 26L is removed by a wet-etching, and then a first silicon oxide layer 50aL (24aL) is formed on the surface of the wafer by a thermal oxidation method. The silicon oxide layer 50aL (24aL) becomes a first insulation layer 50a that forms an intermediate insulation layer 50 of the memory transistor 400, and also a first insulation layer 24a that forms a gate insulation layer 24 of the third voltage-type transistor 300. The silicon oxide layer 50aL (24aL) may preferably have a thickness of 5–15 nm, for example.

The silicon oxide layer may preferably be formed by any one of the following thermal oxidation methods:
(a) a dry-oxidation is conducted at 700–1000° C.;
(b) after the dry-oxidation conducted in step (a), a wet-oxidation is further conducted at 700–1000° C.; and
(c) after step (a) or step (b), an anneal treatment is conducted in a nitrogen atmosphere at 700–1000° C. for 10–30 minutes.

By conducting the dry-oxidation in step (a) described above, the size of polysilicon grains on the surface of the floating gate 40 becomes uniform, and the planarization of the surface of the floating gate 40 is improved. As a result, the interface state of the floating gate 40 becomes more stabilized, the electron capturing is reduced, and the cycle life of write/erase operations of the memory transistor is extended.

Further, when at least one of the wet-oxidation in step (b) and the anneal treatment in step (c) is added after the dry-oxidation in step (a), the silicon oxide layer 50aL is further densified, and the electron capturing is reduced, such that the film characteristics can be improved.

Figure 8:
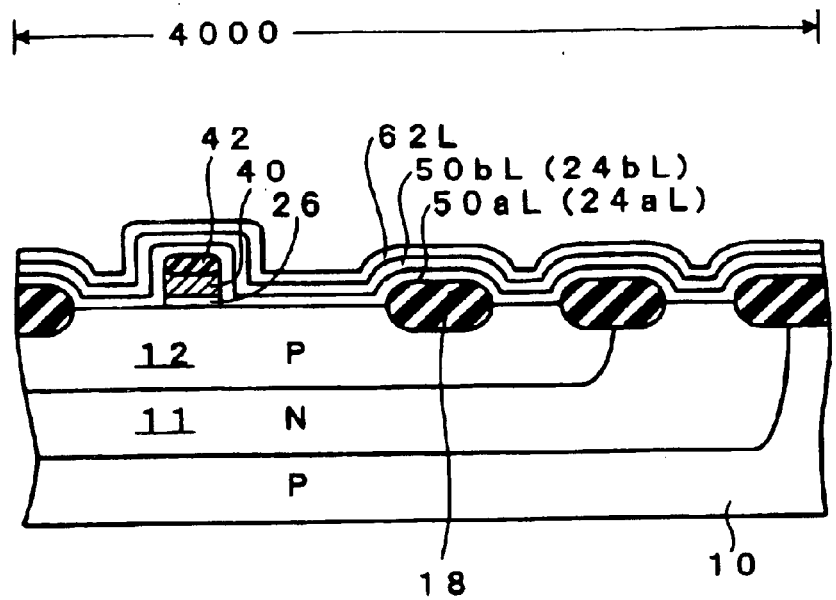
Figure 8:
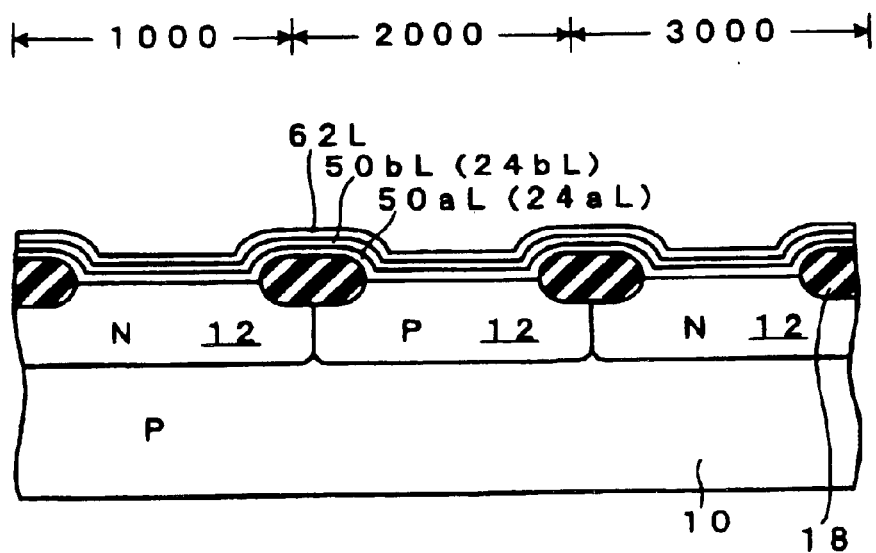

(G) Then, as shown in FIG. 8, a second silicon oxide layer 50bL (24bL) is further formed on the surface of the first silicon oxide layer 50aL (24aL). The second silicon oxide layer 50bL (24bL) is formed by a CVD method. The second silicon oxide layer 50bL (24bL) becomes a second insulation layer 50b that forms an intermediate insulation layer 50 of the memory transistor 400, and a second insulation layer 24b that forms a gate insulation layer 24 of the third voltage-type transistor 300. The silicon insulation layer 50bL (24bL) has a thickness of 10–20 nm, for example.

Considering the density of the formed film, the permeability resistance against oxygen ions and the like in a thermal oxidation to be performed in a later stage, the CVD method used in this embodiment may preferably be conducted by a HTO (high temperature oxide) method, using monosilane or tetraethylorthosilicate, a TEOS (tetraethyl orthosilicate) method, using ozone as an oxidation agent or a plasma TEOS method. A preferred temperature for a HTO method is about 700–900° C.

Next, a second silicon nitride layer 62L is formed on the surface of the silicon oxide layer 50bL (24bL). The second silicon nitride 62L may preferably have a film thickness of 10–20 nm. Due to the second silicon nitride layer 62L thus formed, although the second silicon nitride layer 62L will be removed in step (J) that is later performed, the intermediate insulation layer 50 of the memory transistor 400 and the gate insulation layer 24 of the third voltage-type transistor 300 do not unnecessarily become thick, and thus the film thickness can be precisely controlled. Then, an anneal treatment may be conducted at 700–1000° C. for about 20–40 minutes to densify the insulation layers.

Figure 9:
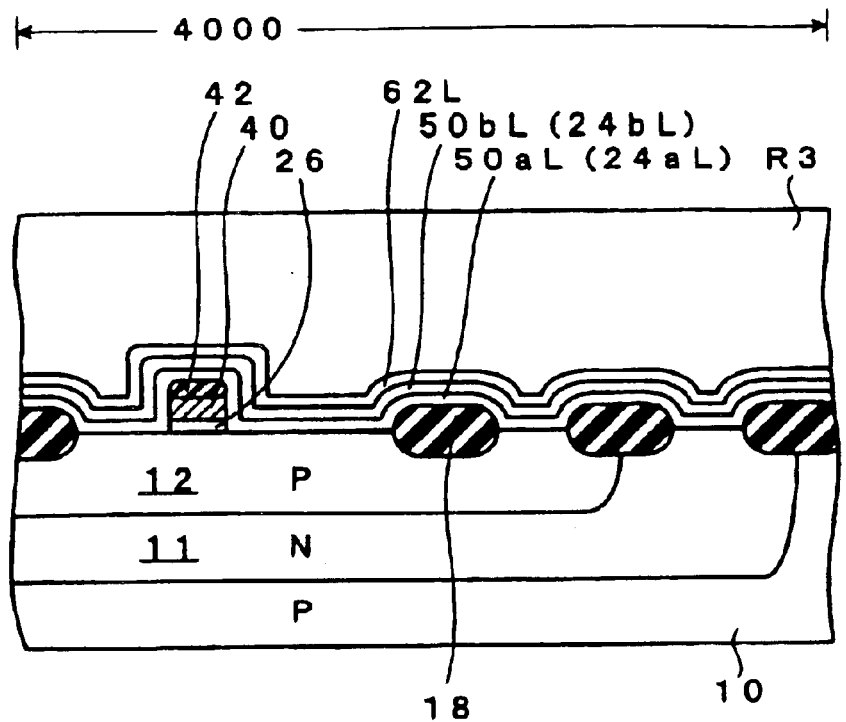
Figure 9:
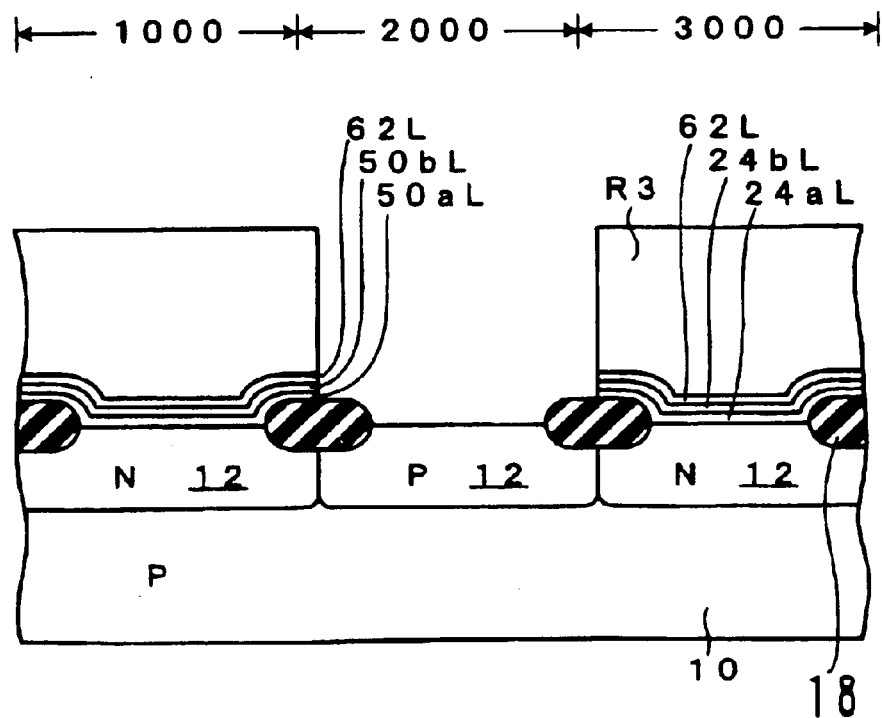

(H) Then, as shown in FIG. 9, a resist layer R3 defining an opening section in the second transistor region 2000 is formed. The second silicon nitride layer 62L, the upper silicon oxide layer 50bL and the lower silicon oxide layer 50aL in the transistor region 2000 may be removed by a dry-etching and a wet-etching, using the resist layer R3 as a mask. Then, the resist layer R3 is removed.

Figure 10:
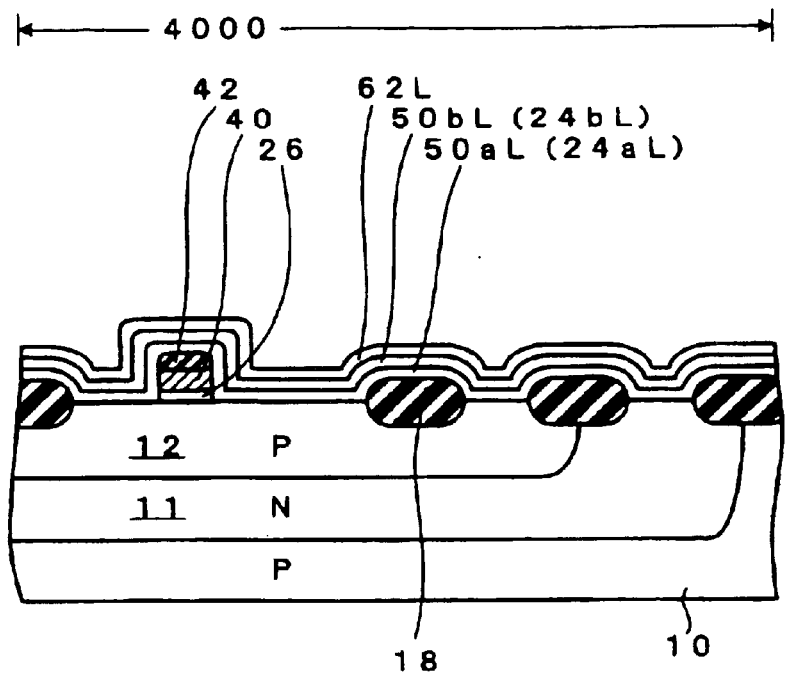
Figure 10:
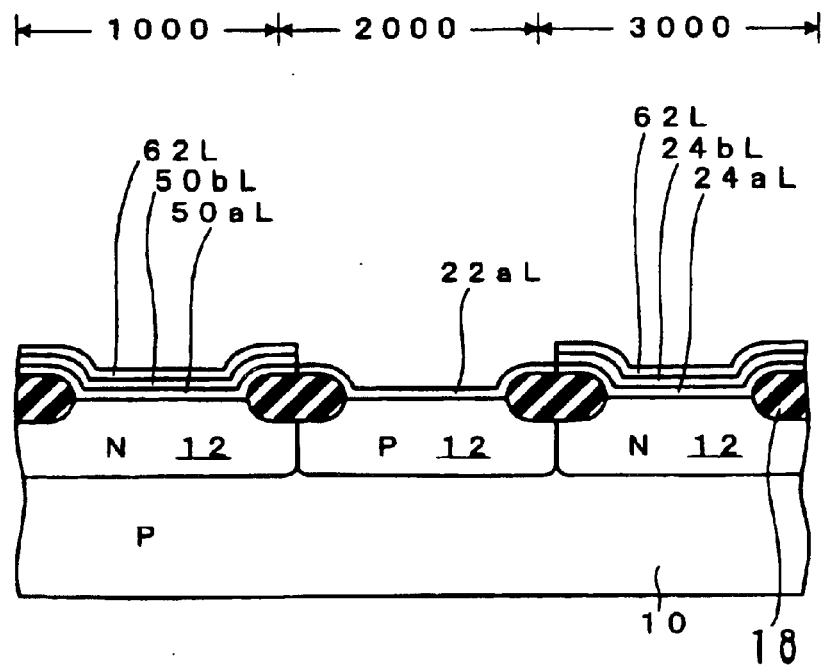

(I) Then, as shown in FIG. 10, the surface of the wafer is subjected to a thermal oxidation, for example, a wet-oxidation at 700–900° C., to thereby form a third silicon oxide layer 22aL on the surface of the wafer. The silicon oxide layer 22aL becomes a first insulation layer 22a that forms the gate insulation layer 22 of the second voltage-type transistor 200. The silicon oxide layer 22aL has a film thickness of 3–15 nm, for example.

Figure 11:
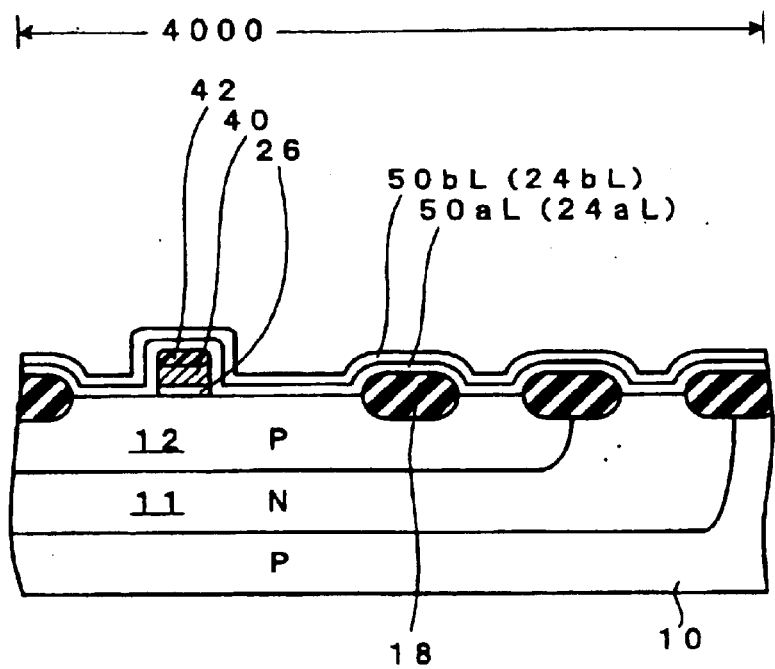
Figure 11:
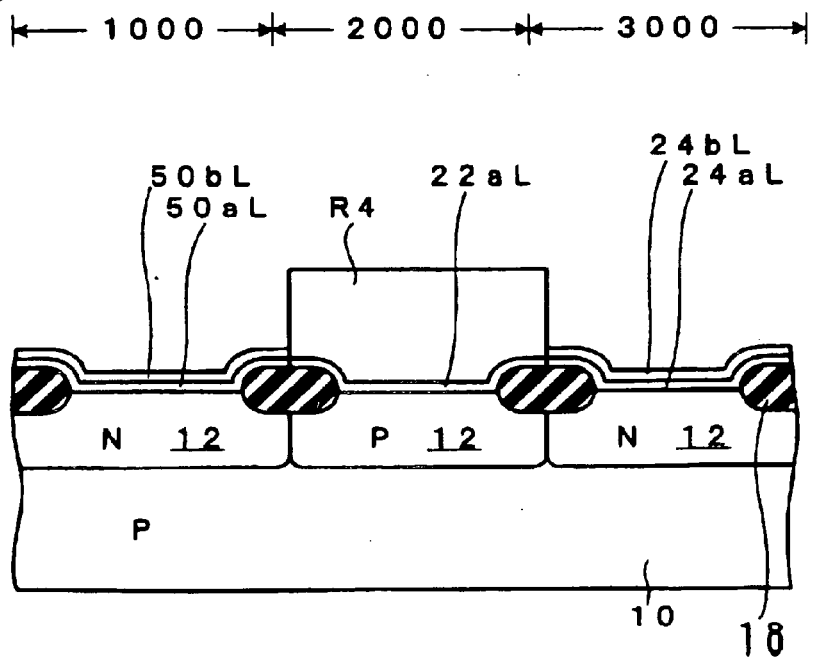

(J) Then, as shown in FIG. 11, a resist layer R4 is formed on the surface of the silicon oxide layer 22aL in the second transistor region 2000. The second silicon nitride layer 62L is removed by a dry-etching, using the resist layer R4 as a mask. Thereafter, the resist layer R4 is removed.

Figure 12:
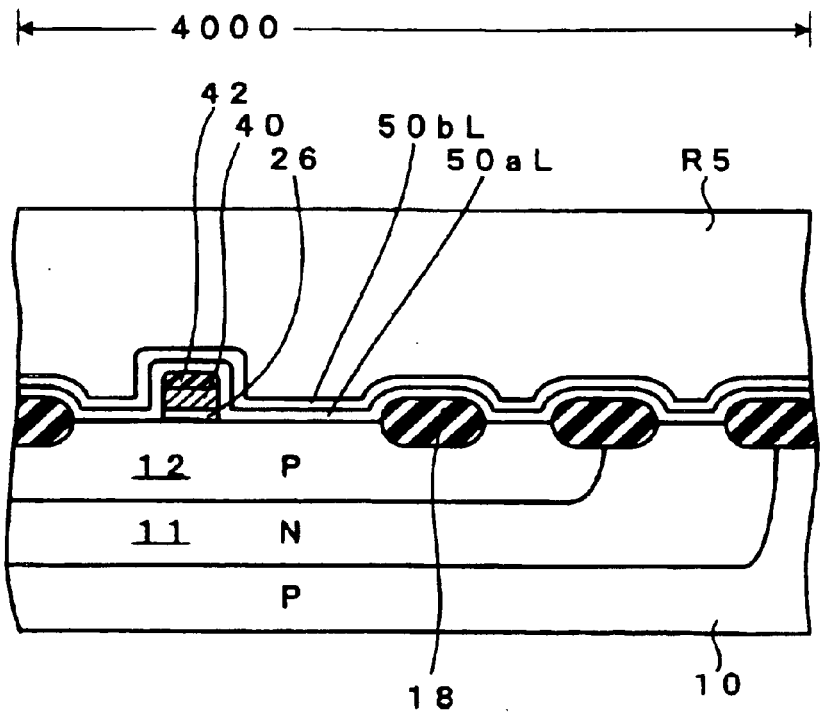
Figure 12:
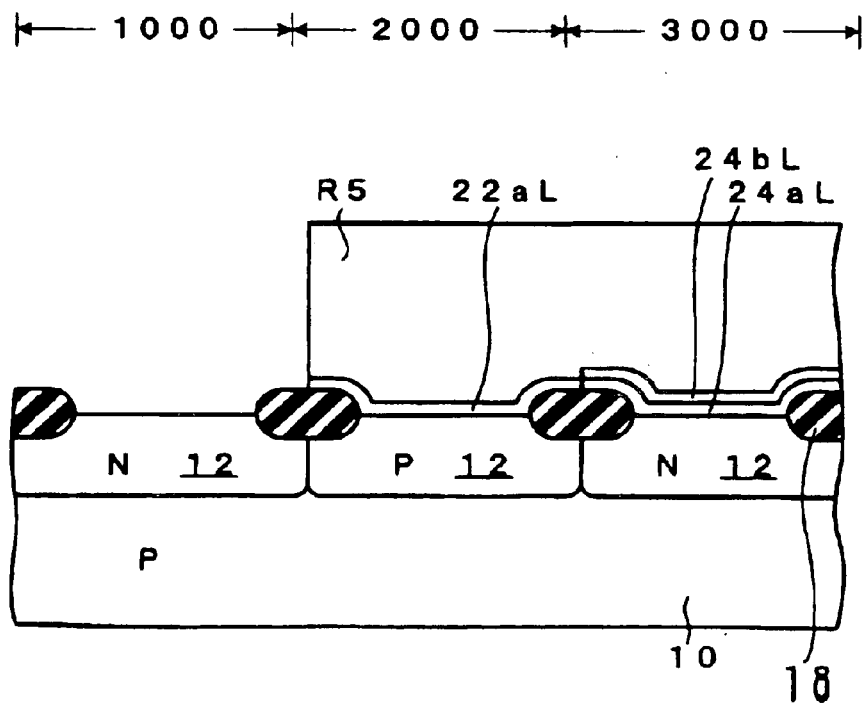

(K) Then, as shown in FIG. 12, a resist layer R5 defining an opening in the first transistor region 1000 is formed. The two silicon oxide layers 50bL and 50aL in the first transistor region 1000 are removed by a wet-etching, using the resist layer R5 as a mask. Then, the resist layer R5 is removed.

Figure 13:
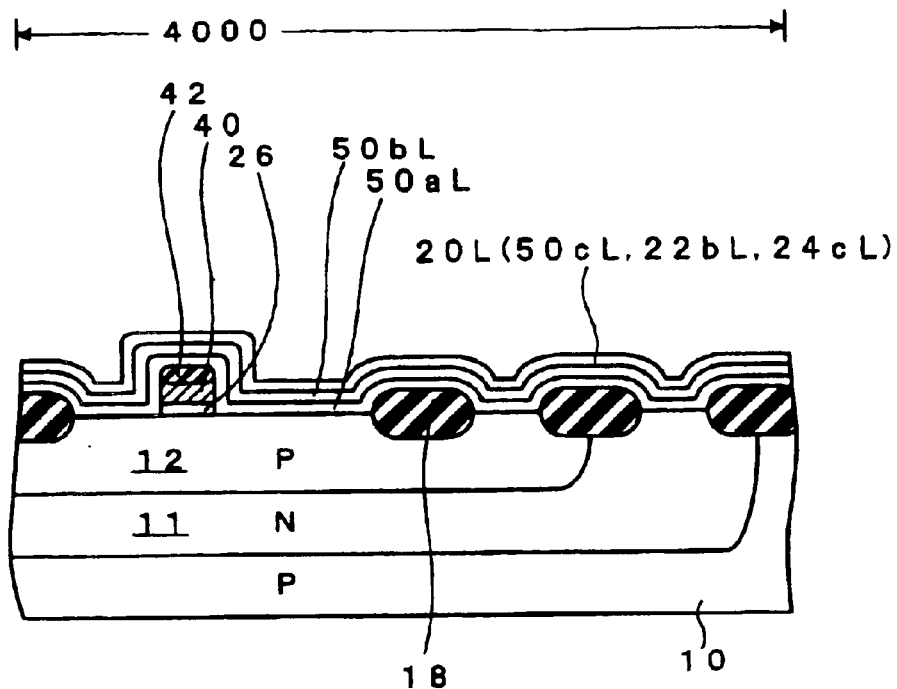
Figure 13:
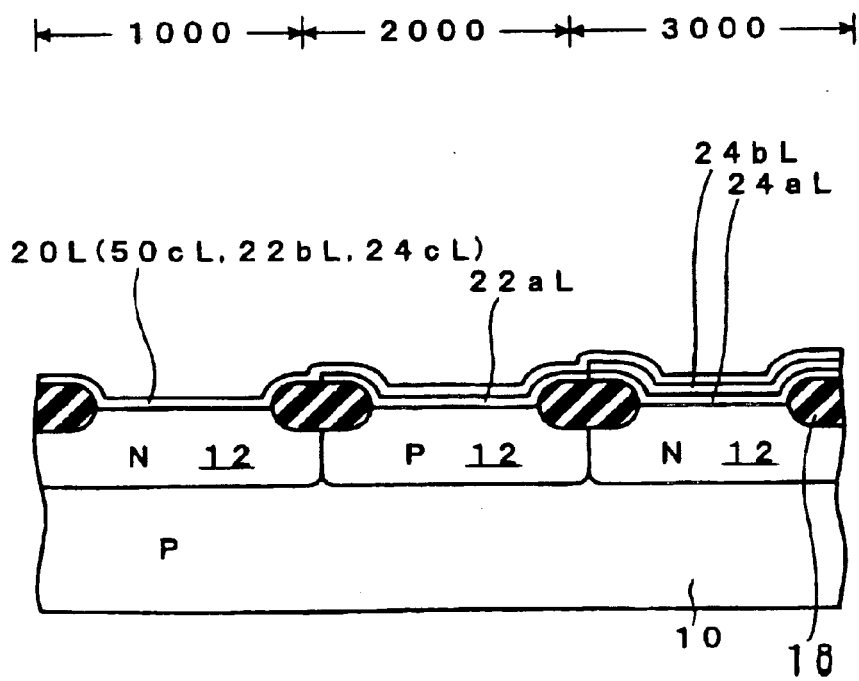

(L) Then, as shown in FIG. 13, the surface of the wafer is subjected to a thermal oxidation, for example, a wet-oxidation conducted at 700–900° C., to form a fourth silicon oxide layer 20L (50cL, 22bL, 24cL) on the surface of the wafer. The silicon oxide layer 20L becomes the gate insulation layer 20 of the first voltage-type transistor 100, the second insulation layer 22b that forms the gate insulation layer 22 of the second voltage-type transistor 200, the third insulation layer 24c that forms the gate insulation layer 24 of the third voltage-type transistor 300, and the third insulation layer 50c that forms the intermediate insulation layer 50 of the memory transistor 400. The silicon oxide layer 20L has a film thickness of 1–10 nm, for example.

The steps described above form the insulation layers that compose the intermediate insulation layer 50 of the memory transistor 400, the gate insulation layer 20 of the first voltage-type transistor 100, the gate insulation layer 22 of the second voltage-type transistor 200 and the gate insulation layer 24 of the third voltage-type transistor 300.

Figure 14:
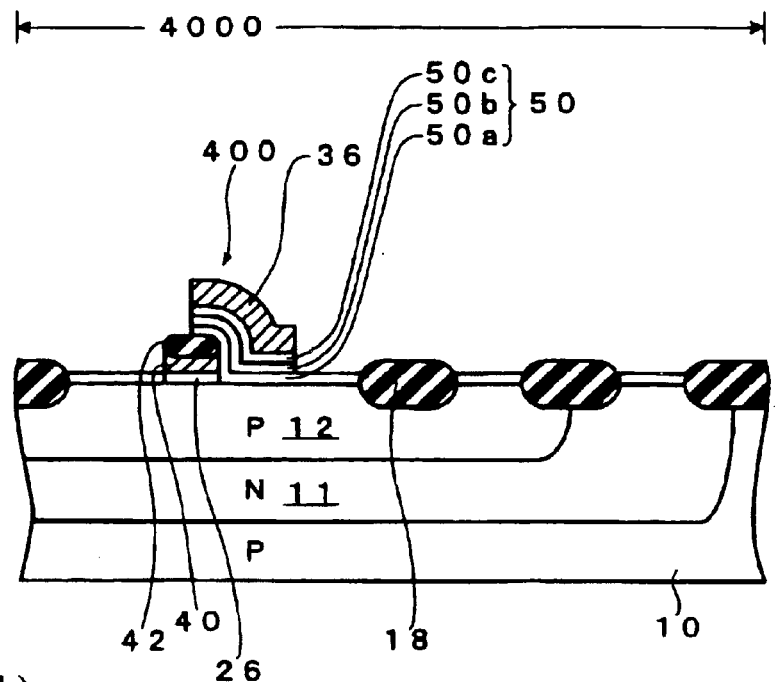
Figure 14:
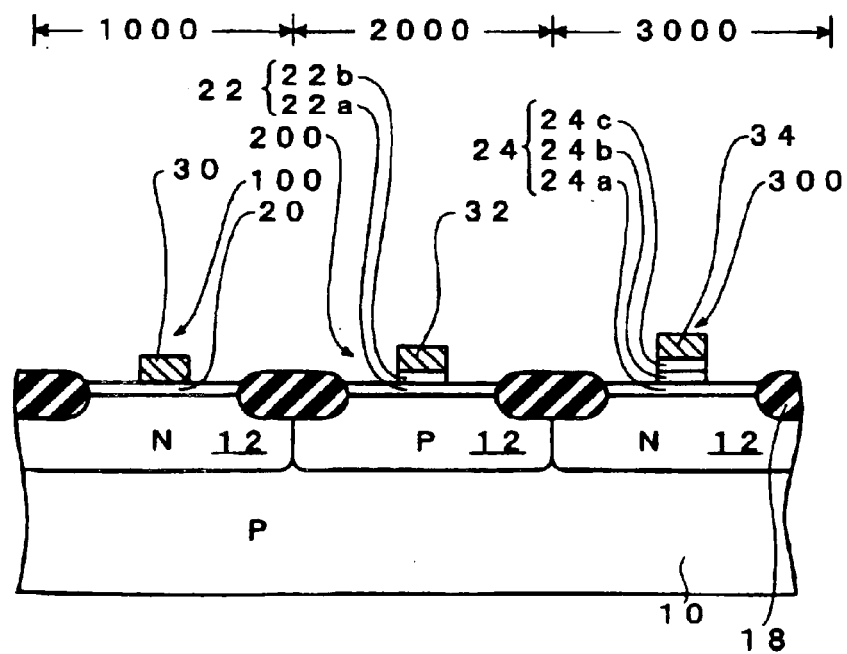

(M) Then, as shown in FIG. 14, a polysilicon layer is formed on the surface of the wafer in the same manner as conducted in step (C) described above. Alternatively, a polycide layer may be formed by a know method, instead of a polysilicon layer. A resist layer having a predetermined pattern is formed on the polysilicon layer, and then a patterning is conducted by an etching to form a gate insulation layer and a gate electrode of each of the memory transistor 400, the first voltage-type transistor 100, the second voltage-type transistor 200 and the third voltage-type transistor 300. In this embodiment, the etching is conducted in a manner that the silicon oxide layer remains to a preferred film thickness of 1–5 nm on exposed surfaces of the silicon substrate 10.

(N) Then, as shown in FIG. 1, an N-type impurity is doped by a known method in predetermined regions of the first wells 11 and in predetermined regions of the P-type second wells 12 to thereby form an N$^+$ type contact region 15 and N$^+$ type source 16 and drain 14 in the respective regions. Also, a P-type impurity is doped by a known method in predetermined regions of the N-type second well 12 and in predetermined regions of the second well 12 in the memory region 4000 to thereby form a P$^+$ type source 16 and drain 14, and a P$^+$ type contact region 13 in the respective regions. The impurity diffusion layers have an impurity concentration of $1$–$8 \times 10^{20}$ cm$^{-3}$.

Then, an interlayer dielectric layer 600 that is composed of a silicon oxide layer is formed by, for example, a CVD method on the surface of the wafer on which the transistors 100, 200 and 300 and the memory transistor 400 are formed. Then, the interlayer dielectric layer 600 is selectively etched to remove predetermined regions thereof to define contact holes that reach the sources 16, the drains 14, the P$^+$ type contact regions 13 and the N$^+$ type contact regions 15. Then, a conductive layer composed of an aluminum layer or the like is deposited on the top surface of the interlayer dielectric layer 600 and in the contact holes by, for example, a sputtering method. The conductive layer is patterned to form metal wiring layers (for example, bit lines and source lines) 80 that electrically connect to the impurity diffusion regions.

In the manufacturing method described above, the memory transistor 400, the first voltage-type transistor 100, the second voltage-type transistor 200 and the third voltage-type transistor 300 are formed in the memory region 4000, the first transistor region 1000, the second transistor region 2000 and the third transistor region 3000. According to this manufacturing method embodiment, a semiconductor device having a memory transistor with a split-gate structure and transistors that operate at at least three different voltage levels mounted therein can be manufactured with fewer manufacturing steps.

In accordance with the manufacturing method embodiment described above, the second insulation layer 22b that forms the gate insulation layer 22 of the second voltage-type transistor 200 is formed in the same step in which the gate insulation layer 20 of the first voltage-type transistor 100 is formed. Similarly, the third insulation layer 24c that forms the gate insulation layer 24 of the third voltage-type transistor 300 and the third insulation layer 50c that forms the intermediate insulation layer 50 of the memory transistor 400 are formed in the same step in which the gate insulation layer 20 of the first voltage-type transistor 100 is formed. Also, the first through the third insulation layers 24a, 24b and 24c that form the gate insulation layer 24 of the third voltage-type transistor 300 are formed in the same steps in which the first through the third insulation layers 50a, 50b and 50c that form the intermediate insulation layer 50 of the memory transistor 400 are formed, respectively. In this manner, the gate insulation layer and the intermediate insulation layer are formed by common steps. As a result, gate insulation layers having different dielectric strengths, in other words, different film thickness, can be formed by fewer steps.

In steps (F) and (G) in the manufacturing method embodiment described above, the silicon oxide layers 50aL and 50bL that form the first and the second insulation layers 50a and 50b of the intermediate insulation layer (tunnel insulation layer) 50 are formed, and then the second silicon nitride layer 62L is formed. As a result, the silicon oxide layers 50aL and 50bL are covered and protected by the silicon nitride layer 62L in a thermal oxidation that is later conducted or in cleaning steps before or after the thermal oxidation. Any adverse effects of the thermal oxidation step and the cleaning steps on the silicon oxide layers can be inhibited. As a result, a tunnel insulation layer having an excellent characteristic can be obtained, and highly reliable memory characteristics can be realized.

Further, while the second silicon nitride layer 62L is formed on the silicon oxide layers 50aL and 50bL, a thermal treatment (including a thermal treatment in an oxidation process) is preferably conducted. As a result, the silicon oxide layers are densified and the film quality of the silicon oxide layers is improved. Thus, the memory characteristics can be improved. In particular, the number of data writing/erasing operations (cycle life) can be extended.

In accordance with the embodiments of the present invention, transistors other than memory transistors can be formed in the memory region 4000. The first well 11 is formed in the memory region 4000. As a result, the potential of the second well 12 where the transistor is formed can be set independently of the potential of the silicon substrate 10. Accordingly, potentials in an absolute value applied to the source and the drain can be reduced. Therefore, the design values of the respective junction dielectric strengths can be lowered. This facilitates the design of a device. Consequently, the design of a circuit using the device (for example, step-up circuit) can be facilitated.

What is claimed:

1. A semiconductor device having a non-volatile memory transistor having a split-gate structure, the semiconductor device comprising:

a semiconductor substrate of a first conductivity type having a memory region;

a first well of a second conductivity type located in the memory region; and a second well of a first conductivity type located in the first well, wherein the non-volatile memory transistor includes a source and drain that are located in the second well;

wherein the non-volatile memory transistor is operated using voltages including positive and negative voltages;

wherein, for writing data in the non-volatile memory transistor, a voltage in an opposite polarity is applied to the control gate, a voltage in one polarity is applied to one of the source and the drain, a voltage in the opposite polarity is applied to the other of the source and the drain, a voltage in the opposite polarity is applied to the second well, and a voltage in the one polarity is applied to the first well;

wherein, for erasing data in the non-volatile memory transistor, a voltage in the one polarity is applied to the control gate, a voltage in the opposite polarity is applied to one of the source and the drain, a voltage in the opposite polarity is applied to the other of the source and the drain, a voltage in the opposite polarity is applied to the second well, and a voltage in the one polarity is applied to the first well;

wherein, for writing data in the non-volatile memory transistor, a voltage of −3 V through −4 V is applied to the control gate, a voltage of +3 V through +4 V is applied to one of the source and the drain, a voltage of −5 V through −6 V is applied to the other of the source and the drain, a voltage of −5 V through −6 V is applied to the second well, and a voltage of +0.9 V through +3.3 V is applied to the first well; and wherein, for erasing data in the non-volatile memory transistor, a voltage of +6 V through +7 V is applied to the control gate, a voltage of −5 V through −6 V is applied to one of the source and the drain, a voltage of −5 V through −6 V is applied to the other of the source and the drain, a voltage of −5 V through −6 V is applied to the second well, and a voltage of +0.9 V through +3.3 V is applied to the first well.

2. A semiconductor device having a non-volatile memory transistor having a split-gate structure, the semiconductor device comprising:

a semiconductor substrate of a first conductivity type having a memory region;

a first well of a second conductivity type located in the memory region;

a second well of a first conductivity type located in the first well, wherein the non-volatile memory transistor includes a source and drain that are located in the second well;

wherein the non-volatile memory transistor has a gate insulation layer, a floating gate, a control gate and an intermediate insulation layer functioning as a tunnel insulation layer, wherein
   the gate insulation layer is located above the second well and between one of the source and drain and the other of the source and drain,
   the floating gate is located above the first gate insulation layer,
   the intermediate insulation layer is located above the floating gate and the semiconductor substrate, and
   the control gate is located above the intermediate insulation layer and rests on the floating gate through the intermediate insulation layer;

wherein the semiconductor substrate includes first, second and third transistor regions including field effect transistors that operate at different voltage levels, wherein
   the first transistor region includes a first voltage-type transistor that operates at a first voltage level,
   the second transistor region includes a second voltage-type transistor that operates at a second voltage level, and
   the third transistor region includes a third voltage-type transistor that operates at a third voltage level, wherein the second voltage-type transistor has a gate insulation layer formed from at least two insulation layers, and includes an insulation layer that is formed in the same step in which a gate insulation layer of the first voltage-type transistor is formed;

wherein the third voltage-type transistor has a gate insulation layer formed from at least three insulation layers, and includes an insulation layer that is formed in the same step in which the gate insulation layer of the first voltage-type transistor is formed, wherein the intermediate insulation layer of the non-volatile memory transistor is formed from at least three insulation layers, wherein first and second outermost layers of the three insulation layers respectively contact the floating gate and the control gate and are formed from a thermal oxidation method;

wherein the intermediate insulation layer includes an insulation layer between the first and the second outermost layers, that is formed by a CVD method; and wherein the insulation layer between the first and second outermost layers that is formed by a CVD method is a silicon oxide layer formed by a CVD method selected from a group consisting of a HTO (high temperature oxide) method and a TEOS (tetraethyl orthosilicate) method.

3. A semiconductor device having a non-volatile memory transistor having a split-gate structure, the semiconductor device comprising:

a semiconductor substrate of a first conductivity type having a memory region;

a first well of a second conductivity type located in the memory region;

a second well of a first conductivity type located in the first well, wherein the non-volatile memory transistor includes a source and drain that are located in the second well;

wherein the non-volatile memory transistor has a gate insulation layer, a floating gate, a control gate and an intermediate insulation layer functioning as a tunnel insulation layer, wherein the gate insulation layer is located above the second well and between one of the source and drain and the other of the source and drain, the floating gate is located above the first gate insulation layer, the intermediate insulation layer is located above the floating gate and the semiconductor substrate, and the control gate is located above the intermediate insulation layer and rests on the floating gate through the intermediate insulation layer;

wherein the semiconductor substrate includes first, second and third transistor regions including field effect transistors that operate at different voltage levels, wherein the first transistor region includes a first voltage-type transistor that operates at a first voltage level, the second transistor region includes a second voltage-type transistor that operates at a second voltage level, and the third transistor region includes a third voltage-type transistor that operates at a third voltage level, wherein the second voltage-type transistor has a gate insulation layer formed from at least two insulation layers, and includes an insulation layer that is formed in the same step in which a gate insulation layer of the first voltage-type transistor is formed;

wherein the third voltage-type transistor has a gate insulation layer formed from at least three insulation layers, and includes an insulation layer that is formed in the same step in which the gate insulation layer of the first voltage-type transistor is formed, wherein the intermediate insulation layer of the non-volatile memory transistor is formed from at least three insulation layers, wherein first and second outermost layers of the three insulation layers respectively contact the floating gate and the control gate and are formed from a thermal oxidation method;

wherein the intermediate insulation layer includes an insulation layer between the first and the second outermost layers, that is formed by a CVD method; and wherein the first outermost layer that forms the intermediate insulation layer of the non-volatile memory transistor has a film thickness of 5–15 nm, and the second outermost layer has a film thickness of 1–10 nm, and the layer formed between the first and the second outermost layers comprises a silicon oxide layer having a film thickness of 10–20 nm.

4. A semiconductor device having a non-volatile memory transistor having a split-gate structure, the semiconductor device comprising:

a semiconductor substrate of a first conductivity type having a memory region;

a first well of a second conductivity type located in the memory region;

a second well of a first conductivity type located in the first well, wherein the non-volatile memory transistor includes a source and drain that are located in the second well;

wherein the non-volatile memory transistor has a first gate insulation layer, a second gate insulation layer, a floating gate, a control gate and an intermediate insulation layer functioning as a tunnel insulation layer;

wherein the first gate insulation layer and the second gate insulation layer are located above the second well and between one of the pair of source and drain and the other of the pair of source and drain, the floating gate is located above the first gate insulation layer, the intermediate insulation layer is located above the floating gate, and the control gate is located above the second gate insulation layer and rests on the floating gate through the intermediate insulation layer;

wherein the semiconductor substrate includes first, second and third transistor regions including field effect transistors that operate at different voltage levels, wherein the first transistor region includes a first voltage-type transistor that operates at a first voltage level of 1.8 –3.3 V, the second transistor region includes a second voltage-type transistor that operates at a second voltage level of 2.5–5 V, and the third transistor region includes a third voltage-type transistor that operates at a third voltage level of 10–15 V ; and wherein the second voltage-type transistor has a gate insulation layer formed from at least two insulation layers, and includes an insulation layer that is formed in the same step in which a gate insulation layer of the first voltage-type transistor is formed.

5. A semiconductor device having a non-volatile memory transistor having a split-gate structure, the semiconductor device comprising:

a semiconductor substrate of a first conductivity type having a memory region;

a first well of a second conductivity type located in the memory region;

a second well of a first conductivity type located in the first well, wherein the non-volatile memory transistor includes a source and drain that are located in the second well;

wherein the non-volatile memory transistor has a gate insulation layer, a floating gate, a control gate and an intermediate insulation layer functioning as a tunnel insulation layer, wherein the gate insulation layer is located above the second well and between one of the source and drain and the other of the source and drain, the floating gate is located above the first gate insulation layer, the intermediate insulation layer is located above the floating gate and the semiconductor substrate, and the control gate is located above the intermediate insulation layer and rests on the floating gate through the intermediate insulation layer;

wherein the semiconductor substrate includes first, second and third transistor regions including field effect transistors that operate at different voltage levels, wherein the first transistor region includes a first voltage-type transistor that operates at a first voltage level, the second transistor region includes a second voltage-type transistor that operates at a second voltage level, and the third transistor region includes a third voltage-type transistor that operates at a third voltage level, wherein the second voltage-type transistor has a gate insulation layer formed from at least two insulation layers, and includes an insulation layer that is formed in the same step in which a gate insulation layer of the first voltage-type transistor is formed;

wherein the semiconductor device further comprises at least a flash-memory (flash EEPROM), wherein the flash-memory includes a memory cell array comprising non-volatile memory transistors and peripheral circuits formed therein; and wherein the semiconductor device further comprises another circuit region mixed together with the flash-memory (flash EEPROM) on the substrate.

6. A semiconductor device having a non-volatile memory transistor according to claim 5, wherein the circuit region includes at least a logic circuit.

7. A semiconductor device having a non-volatile memory transistor having a split-gate structure, the semiconductor device comprising:

a semiconductor substrate of a first conductivity type having a memory region;

a first well of a second conductivity type located in the memory region; and a second well of a first conductivity type located in the first well, wherein the non-volatile memory transistor includes a source and drain that are located in the second well;

wherein the semiconductor substrate further includes first, second and third transistor regions including first, second and third field effect transistors that operate at different voltage levels, the second field effect transistor including a gate insulation layer formed from two silicon oxide layers, and the third field effect transistor including a gate insulation layer formed from three silicon oxide layers.

8. A semiconductor device having a non-volatile memory transistor having a split-gate structure, the semiconductor device comprising:

a semiconductor substrate of a first conductivity type having a memory region;

a first well of a second conductivity type located in the memory region;

a second well of a first conductivity type located in the first well, wherein the non-volatile memory transistor includes a source and drain that are located in the second well;

wherein the non-volatile memory transistor having a split gate structure comprises a source, a drain, a gate insulation layer, a floating gate, an intermediate insulation layer adapted to act as a tunnel insulation layer, and a control gate, wherein the intermediate insulation layer is composed of at least three insulation layers, wherein a first layer of the three insulation layers contacts the floating gate, a third layer contacts the control gate, and a second layer is located between the first and third layers; and wherein the second layer of the intermediate insulation layer is silicon oxide.

9. A semiconductor device according to claim 7, wherein the non-volatile memory transistor includes a source, a drain, a gate insulation layer, a floating gate, an intermediate insulation layer adapted to act as a tunnel insulation layer, and a control gate, wherein the intermediate insulation layer includes at least three insulation layers, wherein a first layer of the at least three insulation layers contacts the floating gate, a third layer of the at least three insulation layers contacts the control gate, and a second layer of the at least three insulation layers is located between the first and third layers, wherein the first, second, and third layers each comprise silicon oxide.

* * * * *